United States Patent
Kolze

(10) Patent No.: US 8,327,240 B2
(45) Date of Patent: Dec. 4, 2012

(54) HANDLING BURST ERROR EVENTS WITH INTERLEAVED REED-SOLOMON (RS) CODES

(75) Inventor: Thomas J. Kolze, Phoenix, AZ (US)

(73) Assignee: Broadcom Corporation, Irvine, CA (US)

( * ) Notice: Subject to any disclaimer, the term of this patent is extended or adjusted under 35 U.S.C. 154(b) by 445 days.

(21) Appl. No.: 12/626,566

(22) Filed: Nov. 25, 2009

(65) Prior Publication Data
US 2010/0131824 A1     May 27, 2010

Related U.S. Application Data

(60) Provisional application No. 61/118,343, filed on Nov. 26, 2008, provisional application No. 61/264,613, filed on Nov. 25, 2009.

(51) Int. Cl.
*H03M 13/00* (2006.01)
(52) U.S. Cl. ......................... 714/784; 714/762
(58) Field of Classification Search .................. 714/781, 714/784, 762
See application file for complete search history.

(56) References Cited

U.S. PATENT DOCUMENTS

| | | | |
|---|---|---|---|
| 6,754,871 B1 * | 6/2004 | Pines et al. | 714/762 |
| 7,788,570 B1 * | 8/2010 | Feng | 714/784 |
| 8,046,659 B1 * | 10/2011 | Liu | 714/752 |

* cited by examiner

*Primary Examiner* — Philip Guyton
(74) *Attorney, Agent, or Firm* — Garlick & Markison; Shayne X. Short

(57) ABSTRACT

Handling burst error events with interleaved Reed-Solomon (RS) codes. A received signal, that has undergone convolutional interleaving sometime before, is received from a burst noise affected communication channel. The signal undergoes convolutional deinterleaving and the codewords generated there from undergo appropriate successive cyclic shifting to arrange burst noise affected symbols of various codewords into at least some common symbol locations. For example, at least two codewords have burst noise affected symbols in common symbol locations. An ensemble decoder jointly decodes multiple codewords during a same time period (i.e., processes multiple codewords simultaneously). By processing multiple codewords simultaneously, the ensemble decoder has greater error correction capability than a decoder that processes a single codeword at a time.

39 Claims, 18 Drawing Sheets

Fig. 14 (showing codewords 508 to 518)

HANDLING BURST ERROR EVENTS WITH INTERLEAVED REED-SOLOMON (RS) CODES

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Applications which are hereby incorporated herein by reference in their entirety and made part of the present U.S. Utility Patent Application for all purposes:

1. U.S. Provisional Application Ser. No. 61/118,343, entitled "Handling burst error events with interleaved Reed-Solomon (RS) codes," filed Nov. 26, 2008, pending.

2. U.S. Provisional Application Ser. No. 61/264,613, entitled "Modified error distance decoding for achieving improved performance in additive white Gaussian noise (AWGN) and burst events with interleaving," filed Nov. 25, 2009, pending.

Incorporation by Reference

The following U.S. Utility Patent Applications are hereby incorporated herein by reference in their entirety and made part of the present U.S. Utility Patent Application for all purposes:

1. U.S. Utility Application Ser. No. 10/136,059, entitled "Chip blanking and processing in S-CDMA to mitigate impulse and burst noise and/or distortion," filed Apr. 30, 2002, now U.S. Pat. No. 7,236,545 B2, issued on Jun. 26, 2007, which claims priority pursuant to 35 U.S.C. §120, as a continuation-in-part (CIP), to the following U.S. Utility Patent Application which is hereby incorporated herein by reference in its entirety and made part of the present U.S. Utility Patent Application for all purposes:

2. U.S. Utility Application Ser. No. 10/000,415, entitled "Detection and mitigation of temporary impairments in a communications channel," filed Nov. 2, 2001, now U.S. Pat. No. 7,308,050, issued on Dec. 11, 2007, which claims priority pursuant to 35 U.S.C. §119(e) to the following U.S. Provisional Patent Application which is hereby incorporated herein by reference in its entirety and made part of the present U.S. Utility Patent Application for all purposes:

2.a. U.S. Provisional Application Ser. No. 60/296,884, entitled "Detection and mitigation of temporary impairments in a communications channel," filed Jun. 8, 2001, now expired.

3. U.S. Utility Application Ser. No. 10/237,853, entitled "Detection and mitigation of temporary (bursts) impairments in channels using SCDMA," filed Sep. 9, 2002, now U.S. Pat. No. 7,570,576 B2, issued on Aug. 4, 2009, which claims priority pursuant to 35 U.S.C. §120, as a continuation-in-part (CIP), to U.S. Utility Application Ser. No. 10/000,415, now U.S. Pat. No. 7,308,050, which is also referenced above.

The U.S. Utility Application Ser. No. 10/237,853, now U.S. Pat. No. 7,570,576 B2, issued on Aug. 4, 2009, also claims priority pursuant to 35 U.S.C. §119(e) to the following U.S. Provisional Patent Application which is hereby incorporated herein by reference in its entirety and made part of the present U.S. Utility Patent Application for all purposes:

3.a. U.S. Provisional Application Ser. No. 60/402,776, entitled "Detection and mitigation of temporary (bursts) impairments in channels using SCDMA," filed Aug. 12, 2002, now expired.

4. U.S. Utility Application Ser. No. 10/962,803, entitled "Chip blanking and processing in SCDMA to mitigate impulse and burst noise and/or distortion," filed Oct. 12, 2004, now U.S. Pat. No. 7,366,258 B2, issued on Apr. 29, 2008, which claims priority pursuant to 35 U.S.C. §120, as a continuation-in-part (CIP), to U.S. Utility Application Ser. No. 10/136,059, now U.S. Pat. No. 7,236,545 B2, issued on Jun. 26, 2007, which is also referenced above, which claims priority pursuant to 35 U.S.C. §120, as a continuation-in-part (CIP), to U.S. Utility Application Ser. No. 10/000,415, now U.S. Pat. No. 7,308,050, issued on Dec. 11, 2007, which is also referenced above.

5. U.S. Utility Application Ser. No. 10/112,009, entitled "Modified branch metrics for processing soft decisions to account for phase noise impact on cluster variance," filed Mar. 30, 2002, now U.S. Pat. No. 7,136,435 B2, issued on Nov. 14, 2006.

6. U.S. Utility Application Ser. No. 10/175,330, entitled "System, method, and computer program product for mitigating burst noise in a communications system," filed Jun. 20, 2002, pending, which claims priority pursuant to 35 U.S.C. §119(e) to the following two (2) U.S. Provisional Patent Applications which are hereby incorporated herein by reference in their entirety and made part of the present U.S. Utility Patent Application for all purposes:

6.a. U.S. Provisional Application Ser. No. 60/308,101, entitled "FEC block reconstruction method, system and computer program product for mitigating burst noise," filed Jul. 30, 2001, now expired.

6.b. U.S. Provisional Application Serial No. 60/299,768, entitled "Method system and computer program product for mitigating burst noise," filed Jun. 22, 2001, now expired.

BACKGROUND OF THE INVENTION

1. Technical Field of the Invention

The invention relates generally to communication systems; and, more particularly, it relates to processing of burst noise affected signals within such communication systems.

2. Description of Related Art

Data communication systems have been under continual development for many years. One such type of communication system that has been of significant interest lately is a communication system that employs iterative error correction codes (ECCs). There are a variety of types of ECCs (e.g., turbo codes, turbo trellis codes, Reed-Solomon (RS) codes, LDPC (Low Density Parity Check) codes, etc.). Communications systems with iterative codes and iterative ECCs are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel (e.g., most typically in the context of an additive white Gaussian noise (AWGN) communication channel), having a particular SNR, that achieves error free transmission through the communication channel. In other words, the Shannon limit is the theoretical bound for channel capacity for a given modulation and code rate. It is of course noted that certain communication channels may suffer from deficiencies other than AWGN (e.g., burst noise, distortion, interference, fading, etc.).

For any particular communication system application areas, near-capacity achieving error correction codes are very desirable. Generally speaking, within the context of communication systems that employ ECC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). ECCs codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel approach is presented herein by which appropriate cyclic shifting of codewords is performed to a convolutional interleaved signal that has incurred a burst noise event during transmission across a communication channel. In one embodiment, cyclic shifting is performed within a receiver communication device when convolutional interleaving is applied rather than block interleaving.

In other embodiments, pre-shifting is also performed within a transmitter located at a sending end of a communication channel. In such an embodiment, the pre-shifting in a transmitter communication device may be complementary to the shifting performed within a receiver communication device. When pre-shifting in a transmitter communication device is performed, the complexity of the receiver communication device may be slightly less complex.

Moreover, either shortened or extended codewords may be processed appropriately as well without departing from the scope and spirit of the invention. When dealing with shortened codewords, either a zero symbol insertion module may be implemented within a receiver communication device to insert zero-valued symbols into codewords in accordance with a shortening parameter by which the codewords are generated. Alternatively, an ensemble decoder that jointly decodes multiple codewords to generate symbols estimates may account for zero-valued symbols, in predetermined locations within the codewords, in accordance with a shortening parameter by which the shortened codewords are generated.

Figure 1:
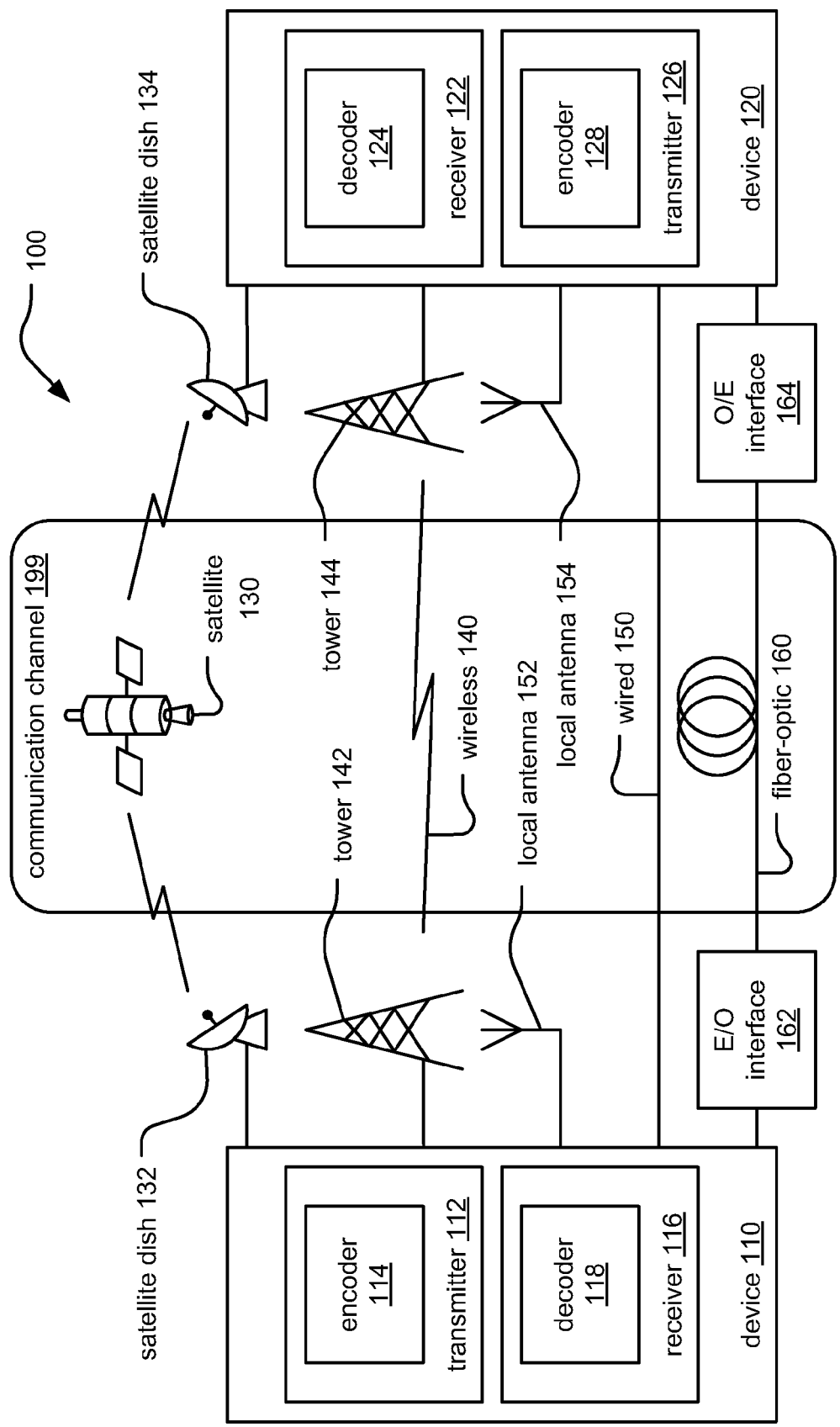
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
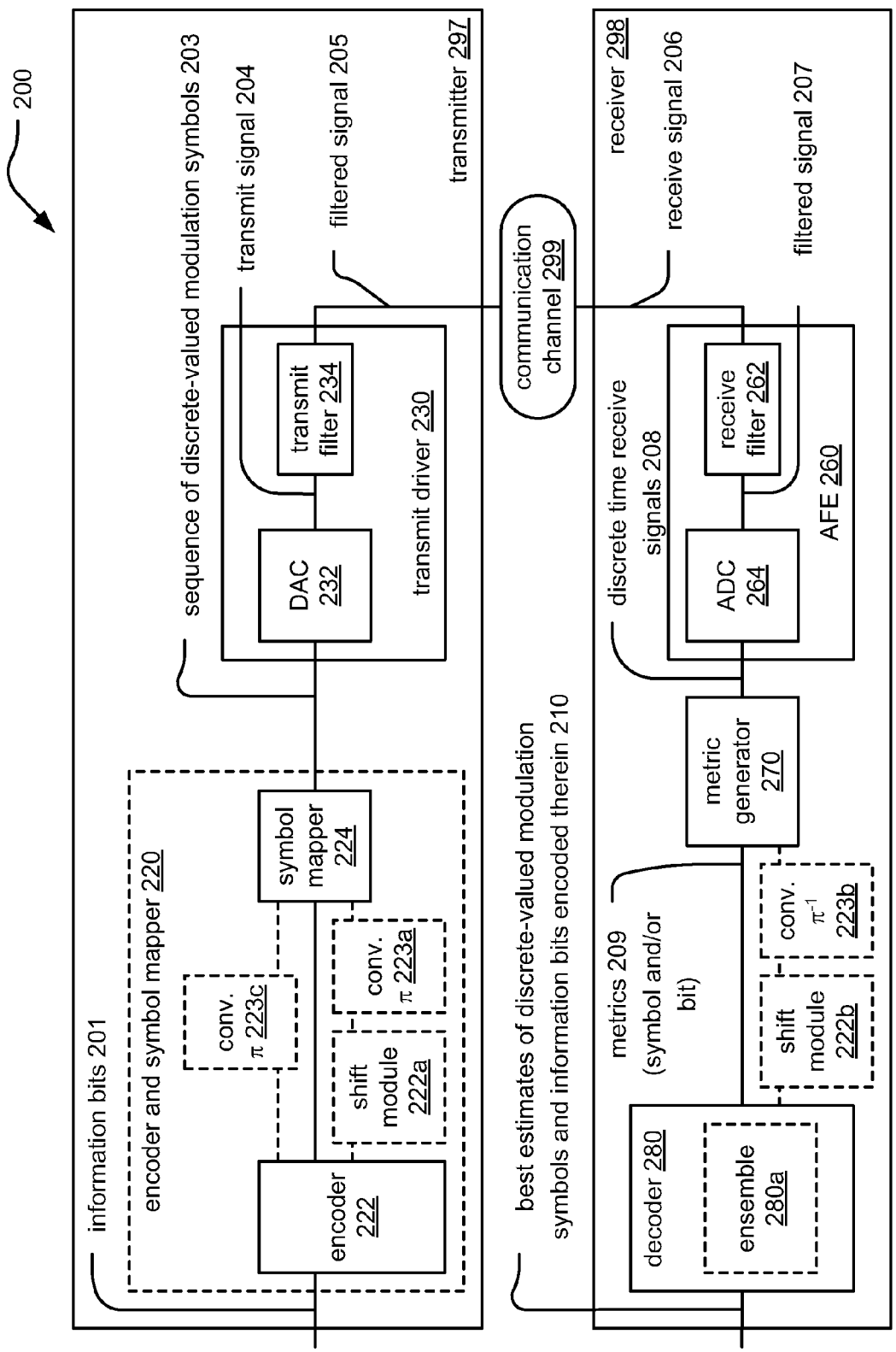

FIG. 1 and FIG. 2 illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199. Also, it is noted that separate and distinct communication channels (may be viewed as being sub-channels: a first for transmit, a second for receive) may be employed for each directional communication in a bi-directional communication system (e.g., one type of communication channel for the transmit path and another type of communication channel for the receive path).

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of ECCs described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 (e.g., codewords) that is provided to a transmit driver 230 that uses a DAC (Digital to Analog Converter) 232 to generate a signal 204 and a transmit filter 234 to generate a filtered signal 205 that substantially comports with the communication channel 299.

In some embodiments, the encoder and symbol mapper 220 may include a shift module 222a followed by a convolutional interleaver 223a (depicted also using π in the diagram); the shift module 222a and the convolutional interleaver 223a are interposed between the encoder 222 and the symbol mapper 224 in such an embodiment. In alternative embodiments, no shift module is included, but only a convolutional interleaver 223c (depicted also using π in the diagram); the convolutional interleaver 223c is then interposed between the encoder 222 and the symbol mapper 224 in such an embodiment.

At a receiving end of the communication channel 299, a received signal 206 is provided to an AFE (Analog Front End) 260 that includes a receive filter 262 (that generates a filtered, received signal 207) and an ADC (Analog to Digital Converter) 264 (that generates discrete-time receive signals 208). A metric generator 270 calculates metrics 209 (e.g., on a symbol and/or bit basis) that are employed by a decoder 280 to make best estimates of the discrete-valued modulation symbols and information bits encoded therein 210. It is noted that the metrics themselves may be influenced and/or modified by a channel fidelity estimator, and/or a burst detector (such as described in the various patent applications/patents that are incorporated by reference above).

In some embodiments, the metric generator 270 may also include a buffer (or other memory storage means) to hold the discrete-time receive signals 208 (e.g., samples) or to hold the metrics generated by the metric generator 270 to allow for a first pass of processing and/or decoding or partial decoding (e.g., as performed by one or more of the convolutional deinterleaver 223b, the shift module 222b, and decoder 280) to allow channel fidelity estimation and/or burst error detection from the subsequent processing blocks to be fed back to the metric generator 270 for another iteration. Based on such feedback received by the metric generator 270, the metric generator 270 may then modify the metrics for use in one or more subsequent iterations.

In even other embodiments, a convolutional deinterleaver 223b (depicted also using $\pi^{-1}$ in the diagram) followed by a shift module 222b may be interposed between the metric generator 270 and the decoder 280. The decoder 280 may be implemented as an ensemble decoder 280a that jointly decodes multiple codewords during a same time period (i.e., processes multiple codewords simultaneously). By processing multiple codewords simultaneously, the ensemble decoder has greater error correction capability than a decoder that processes a single codeword at a time. In one embodiment, this may be performed as described in U.S. Provisional Application Ser. No. 61/264,613, entitled "Modified error distance decoding for achieving improved performance in additive white Gaussian noise (AWGN) and burst events with interleaving," filed Nov. 25, 2009, pending, that is claimed priority to and incorporated by reference above.

The shift module 222b may operate cooperatively and complementarily to the shift module 222a in the transmitter 297. Alternatively, in embodiments in which the transmitter 297 includes no shift module 222a (e.g., includes the convolutional interleaver 223c), the shift module 222b operates independently and can accommodate signals generally generated by a transmitter 297 that does not perform any shifting of codewords therein.

The encoders, decoders and other modules depicted in either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention.

Figure 12:
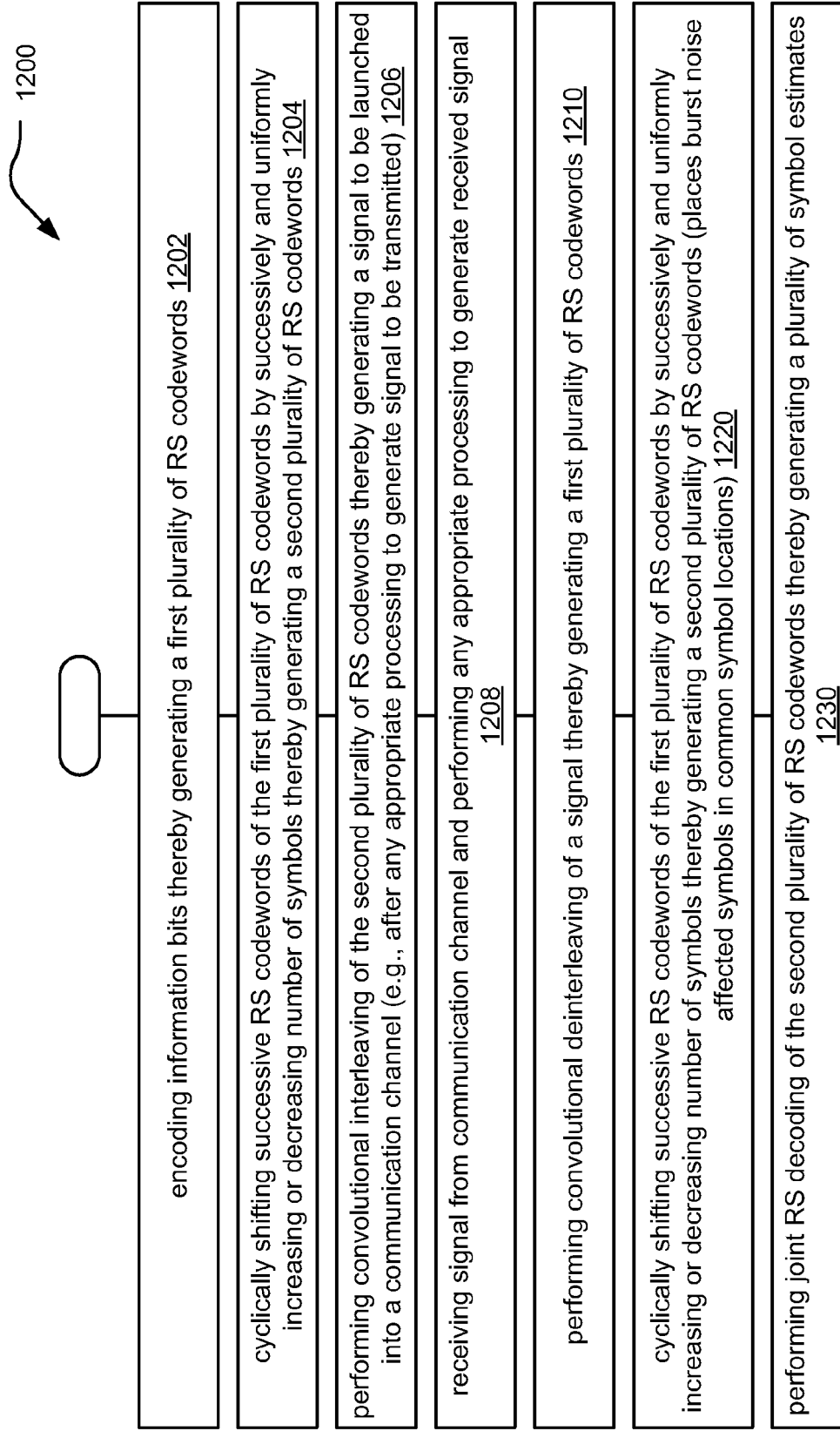

It is noted that standard Reed-Solomon (RS) codewords have a cyclic property such that cyclically shifting such RS codewords will result in another valid codeword being generated. By counter-shifting each successive codeword by the amount of the shift of the burst noise affected symbols as they show up in the convolutionally deinterleaved codewords (e.g., such as within embodiments of FIG. 12/FIG. 13 or FIG. 14 or FIG. 15 described below), the resulting shifted codeword is also a valid codeword (without errors). With counter-cyclic-shifting at a receiver communication device, the locations (ordered, within each affected codeword) of the impacted symbols will become the same, rather than shifted as shown in the embodiments of FIG. 12/FIG. 13 or FIG. 14 or FIG. 15 described below.

Figure 16:
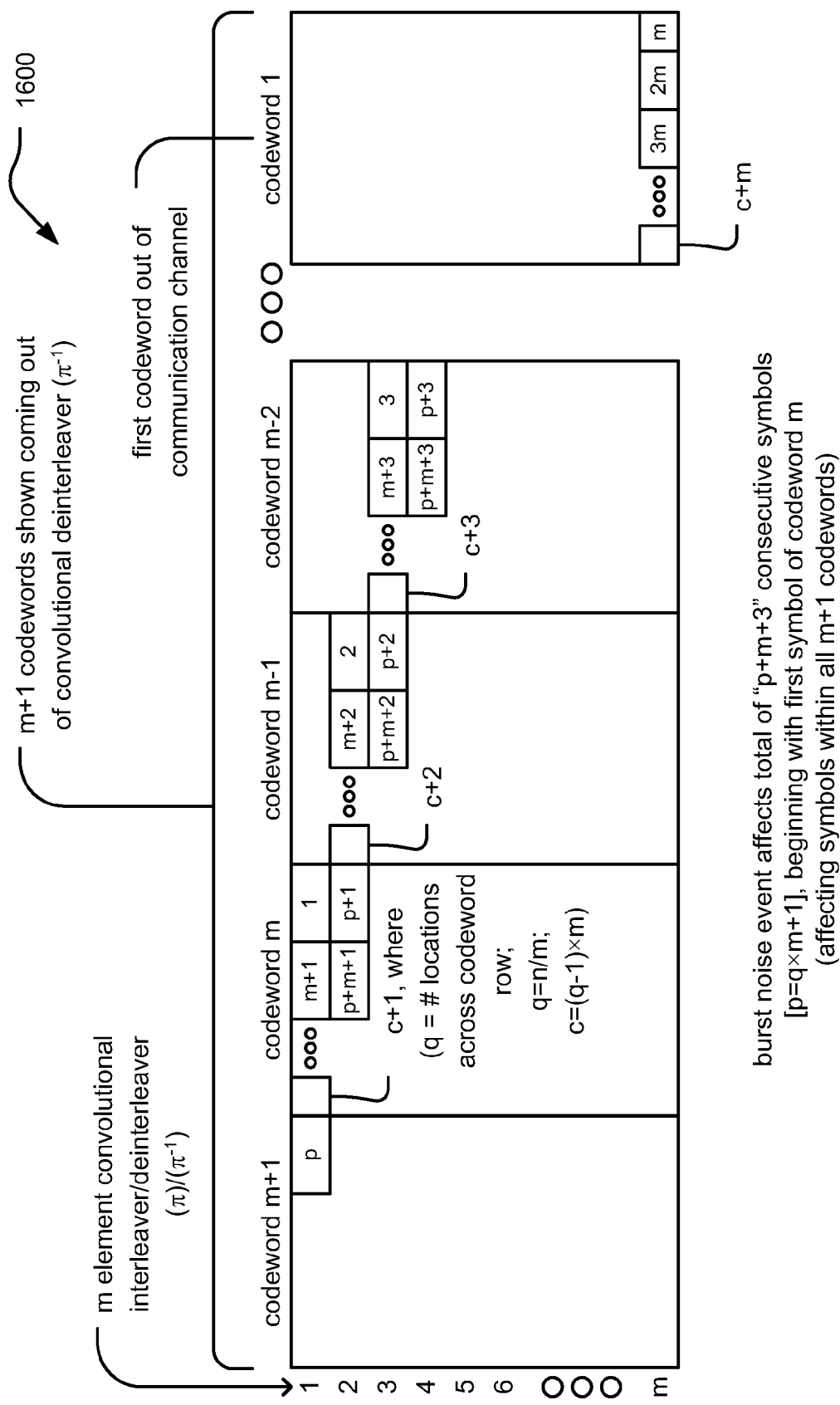
FIG. 16 and FIG. 17 illustrate various embodiments of burst noise affected symbols spanning across multiple codewords.
Figure 17:
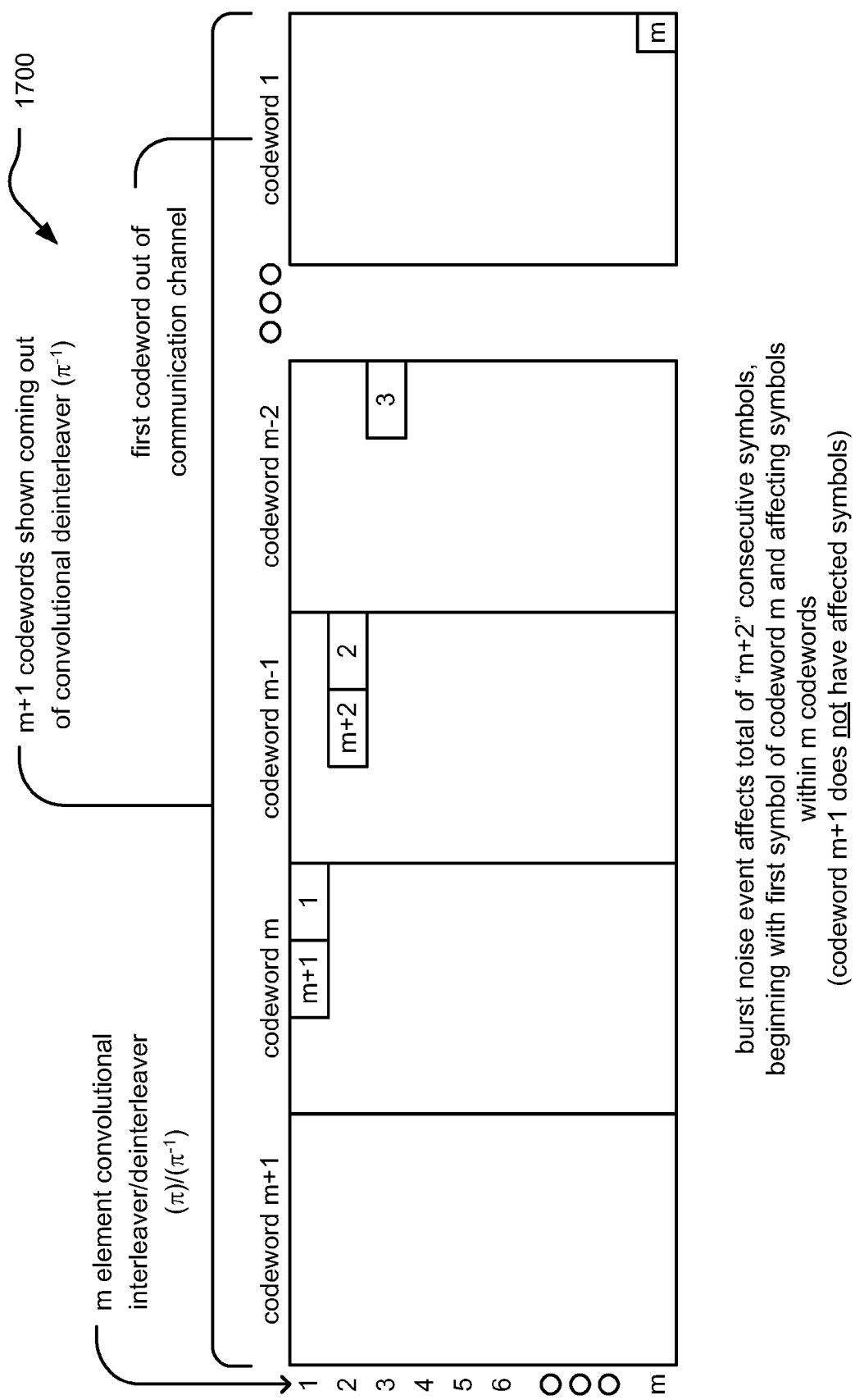

Also, it is noted that although the burst noise event impacts a contiguous block of RS symbols in the communication channel, at the output of the convolutional deinterleaver, even perhaps within a single codeword, contiguously ordered RS symbols are not deleteriously affected, so there is spacing amongst them. This is the case with interleaver dimensions as shown in FIG. 16 and FIG. 17 (e.g., where the number of interleaver branches is a fraction [e.g., integral factor] of the codeword length). However, this is not problematic. The spacing aligns for the successive RS codewords when the counter-shifting is applied.

Depending on the dimensions of an interleaver, there may be instances where the one or more affected symbols of the codeword are not necessarily contiguous within a codeword; even in this instance, the affected symbols will generally align with one another in accordance with the principles of shifting presented herein.

For standard length RS codewords which hold the cyclic property, appropriate cyclic shifting [as described elsewhere herein] in the receiving communication device (e.g., by shift module 222b in receiver 298) is operative to align the burst-induced symbol locations across a set of M codewords, and allow the application of an ensemble decoder to perform joint decoding of multiple RS codewords during a same time period (e.g., as may also be employed when block interleaving/deinterleaving is employed as opposed to convolutional interleaving/deinterleaving). Such an ensemble decoder accommodates for decoding the K information symbols being shifted within the codeword compared to the traditional case due to the cyclic shifting that precedes the decoding. After cyclic shifting a RS codeword, the K information symbols reside in different positions than with the unshifted RS codeword. In some embodiments, for a shifted codeword the symbols in the K positions corresponding to the information symbols in an unshifted codeword may be decoded, and then the actual K information symbols (in different positions) recovered by encoding the K decoded symbols.

FIG. 3, FIG. 4, FIG. 5, and FIG. 6 illustrate various embodiment of an apparatus that performs processing of a signal received from a communication channel.

Figure 3:
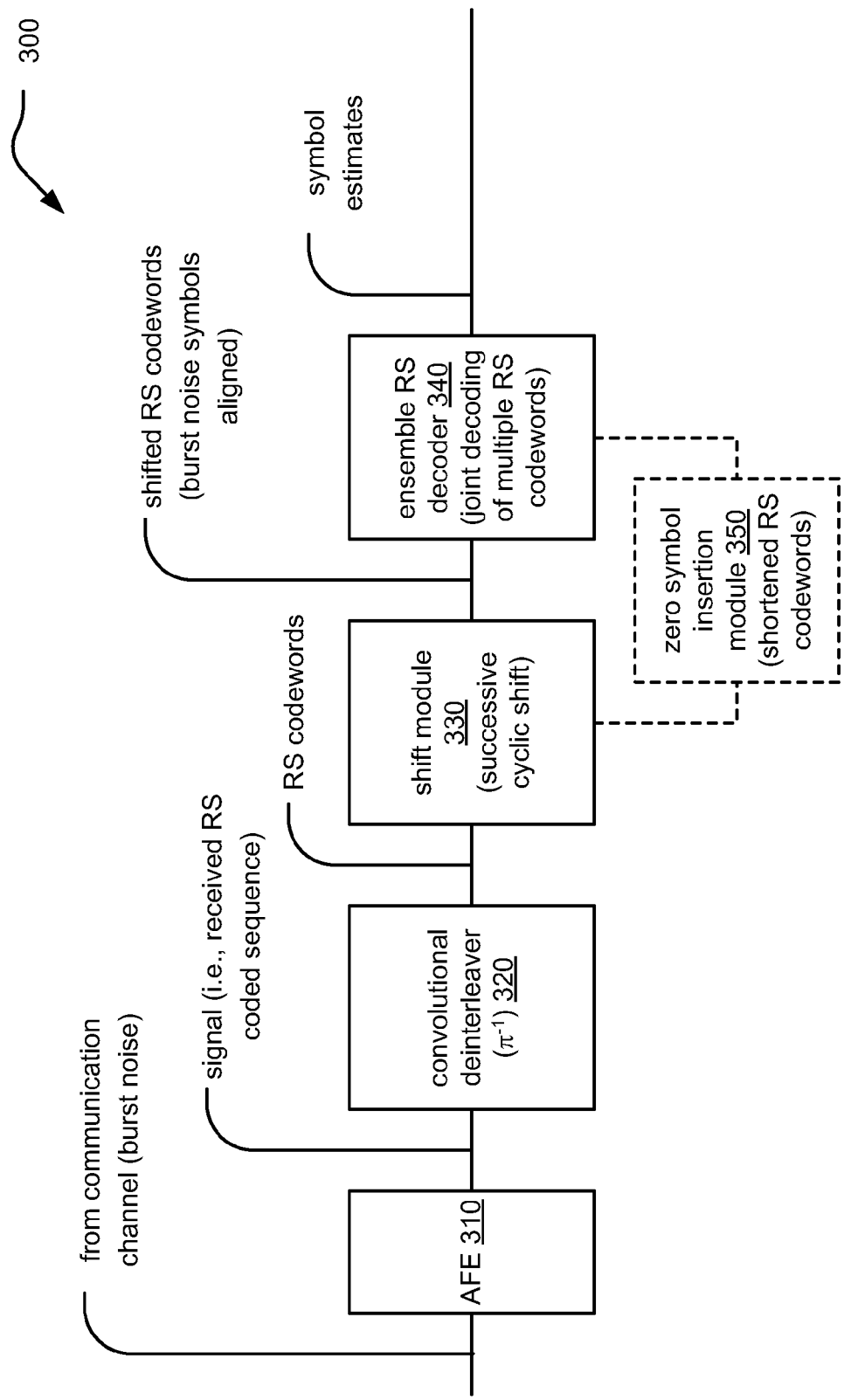
FIG. 3, FIG. 4, FIG. 5, and FIG. 6 illustrate various embodiment of an apparatus that performs processing of a signal received from a communication channel.

Referring to the apparatus 300 in FIG. 3, the apparatus 300 may be any of a variety of types of communication devices including a transceiver or a receiver type of communication device. The apparatus receives a signal from a communication channel and processes it initially using an analog front end (AFE) 310. The AFE 310 can perform any of a variety of necessary operations to convert a received signal received from the communication channel to a digital signal (e.g., a sequence of discrete-valued symbols and/or codewords) such as within a baseband signal. The AFE 310 can perform any necessary or desired operations of frequency shifting, filtering (analog and/or digital), digital sampling (such as within an analog to digital converter (ADC), gain adjustment, and/or any other appropriate processing.

The signal output from the AFE 310 is provided to a convolutional deinterleaver 320 (depicted also using $\pi^{-1}$ in the diagram) that deinterleaves the received signal. The communication channel is a burst noise affected communication channel. The convolutional deinterleaver 320 then outputs a first plurality of Reed-Solomon (RS) codewords. A shift module 330 then cyclically shifts successive RS codewords received from the convolutional deinterleaver 320.

Figure 13:
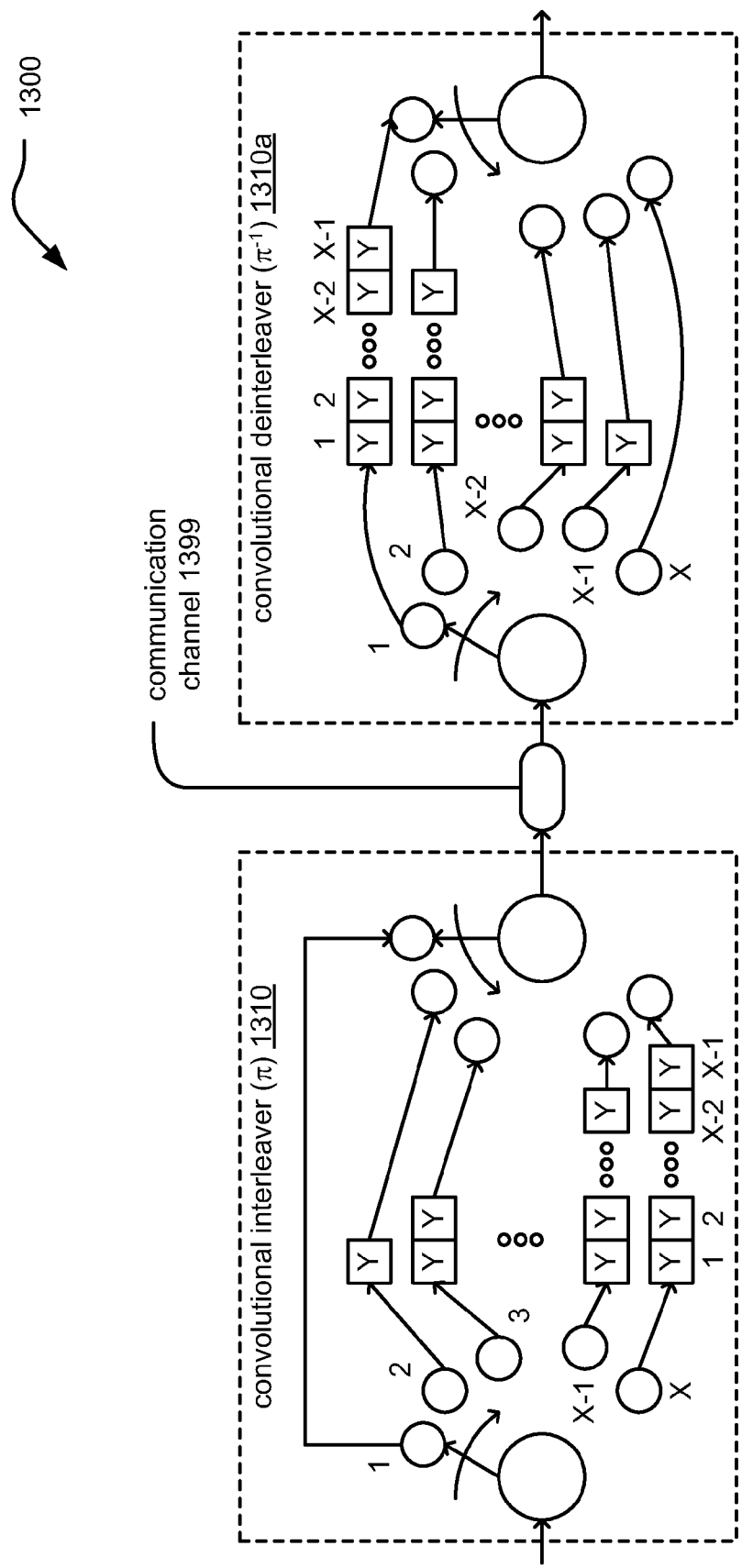
FIG. 13 illustrates an embodiment of convolutional interleaving and deinterleaving.

The cyclic shifting is performed by successively and uniformly increasing or decreasing numbers of symbols thereby generating a second plurality of RS codewords such that at least some of the second plurality of RS codewords have burst noise affected symbols in common symbol locations. With some deinterleaver parameters, this is operative by shifting adjacent codewords by incrementally increasing or decreasing numbers of symbols (e.g., a first codeword is shifted by V symbols, a second codeword [adjacent to the first codeword] is shifted by V+1 symbols, a third codeword [adjacent to the second codeword] is shifted by V+2 symbols, etc.). A positive cyclic shift of 1 symbol position may be defined as moving a symbol #1 into the symbol #2 position, etc. A negative cyclic shift of 1 symbol position may be defined as moving a symbol #2 into the symbol #1 position, etc. Referring below to FIG. 13 for an embodiment of convolutional interleaver/deinterleaver structure and operation, this manner of operation described just above applies when the product of parameters X and Y equals the codeword length, N.

However, again referring below to FIG. 13, when the parameter X is equal to N, and Y is an integer greater than 1, then Y adjacent codewords are shifted identically [e.g., V symbols] (e.g., such as Y successive codewords), and the next Y successive codewords are shifted incrementally [e.g., V+1 symbols].

In instances where the product of X and Y is an integer multiple of the codeword length, N, the shifting pattern is as in the preceding paragraph but with α (where α=(X×Y)/N) successive codewords shifted identically.

The shifting as performed by the shift module 330 ensures that burst noise affected symbols of various codewords are arranged such that at least some common symbol locations include burst noise affected symbols. For example, at least two codewords have burst noise affected symbols in common symbol locations.

It is noted that when extended RS codewords are employed (e.g., the first plurality of codewords includes extended RS codewords) and when there is no pre-shifting performed in the transmitting communication device (e.g., in transmitter 297 in one embodiment), then the shift module 330 cyclically shifts only the non-extended RS symbols within the extended RS codewords.

An ensemble Reed-Solomon (RS) decoder jointly decodes multiple RS codewords during a same time period (i.e., processes multiple RS codewords simultaneously). By processing multiple RS codewords simultaneously, the ensemble RS decoder 340 has greater error correction capability than a traditional RS decoder that processes a single RS codeword at a time. In one embodiment, this may be performed as described in U.S. Provisional Application Ser. No. 61/264,613, entitled "Modified error distance decoding for achieving improved performance in additive white Gaussian noise (AWGN) and burst events with interleaving," filed Nov. 25, 2009, pending, that is claimed priority to and incorporated by reference above. The ensemble RS decoder 340 then outputs symbol estimates corresponding to the multiple RS codewords. When the transmitting communication device includes a shift module (e.g., shift module 222a in transmitter 297 of FIG. 2), the shifting performed therein is complementary to the shifting described just above. The shifting, interleaving, de-interleaving, and de-shifting produce codewords just as if no shifting and de-shifting had been performed except that burst affected symbols are now aligned after the de-shifting.

In an embodiment where the interleaver is synchronized such that there is an identifiable first codeword which the receiver can also identify by a synchronization mechanism, in one embodiment, the codeword shifting is phased such that the first codeword is not shifted. In such an embodiment, this identifiable first codeword is not shifted at the receiver shift module (e.g., shift module 222b in receiver 298 of FIG. 2).

This may be viewed as a first group of a codewords all being shifted by a first identical amount (e.g., an amount that may be 0 [no shifting] when synchronized, such that V=0), a second group of α codewords all being shifted by the a second identical amount (e.g., an amount that may be −1 or +1 [e.g., opposite of shifting in transmitter] when synchronized, such that V=1), etc.

When pre-shifting is performed within a transmitting communication device (e.g., using shift module 222a in transmitter 297 of FIG. 2), shortened RS codewords, extended RS codewords, or any general codewords may be employed without the restriction of those codewords being cyclic and without any deviation from conventional shifting in either location.

When pre-shifting is not performed within a transmitting communication device (e.g., the communication device does not include shift module 222a in transmitter 297 of FIG. 2), then a shift module (e.g., shift module 570 in FIG. 5 or shift module 670 in FIG. 6) is employed which is complementary to the receiver shift module (e.g., shift module 222b in receiver 298 of FIG. 2). Such a complementary shift module may be implemented after the decoder (e.g., after decoder 280 in receiver 298 of FIG. 2). The complementary operation of such two shift modules may also be described with reference to the embodiments of FIG. 5 and FIG. 6.

In some embodiments in which the transmitting communication device does not include a shift module (e.g., does not include shift module 222a in transmitter 297 of FIG. 2), a zero symbol insertion module 350 is interposed in between the shift module 330 and the ensemble RS decoder 340. This zero symbol insertion module 350 may be implemented to accommodate shortened RS codewords that may have been transmitted from a transmitting communication device that launches the signal into the communication channel from which the apparatus 300 receives that same signal. For example, the first plurality of RS codewords may be shortened RS codewords. The zero symbol insertion module 350, interposed between the shift module 330 and the ensemble RS decoder 340, inserts zero-valued symbols into the second plurality of RS codewords in accordance with a shortening parameter by which the shortened RS codewords are generated.

A shortened Reed-Solomon (RS) codeword may be viewed as being a typical RS codeword, but with S of the information symbols of assumed "0" value (e.g., a certain number of information symbols are or a predetermined value such as "0"). Normally these S symbols are located in the same understood location within the standard length codeword (of length Nt), and then are not transmitted, resulting in Nt−S=N length codewords. In other words, each codeword has the same symbol positions understood at both the transmitter and receiver as being the known "0" symbols. One view of the encoding procedure is that K information symbols are accepted at the encoder and then the S known and understood "0" symbols are pre-pended or appended and then normal encoding proceeds as for traditional length codewords.

Note that a burst event impacting one or more symbols that are wrapped around by the cyclic shifting will not align the wrapped burst-affected symbols with those that did not wrap in other codewords, due to the inserted zeroes. By incorporating two or more phases of shifting, this problem is mitigated somewhat, and the likelihood of avoiding the wrapping mismatch of burst affected symbols with at least one of the shifting phases is greatly increased. The drawback is more decoding attempts are required in general.

In alternative embodiments in which no zero symbol insertion module 350 is implemented and in which shortened RS codewords are employed, the ensemble RS decoder 340 can itself account for zero-valued symbols, in predetermined locations within the second plurality of RS codewords, in accordance with a shortening parameter by which the shortened RS codewords are generated.

The apparatus 300 may be viewed as being one communication device located at one end of the burst noise affected communication channel, and another communication device may be located at the other end of the burst noise affected communication channel (e.g., a second/transmitter communication device that communicates with apparatus 300). The second communication device located at the second end of the burst noise affected communication channel may include a RS encoder and a convolutional interleaver. The RS encoder employs a cyclic RS code to encode information bits, and the convolutional interleaver interleaves the RS-encoded information bits thereby generating the signal that eventually gets launched into the communication channel. Of course, analogous and complementary to the AFE 310, the second communication device may also include a corresponding AFE that performs any necessary or desired operations of frequency shifting, filtering (analog and/or digital), analog conversion (such as within a digital to analog converter (DAC), gain adjustment, and/or any other appropriate processing to generate a transmitted signal to be launched into the communication channel).

Figure 4:
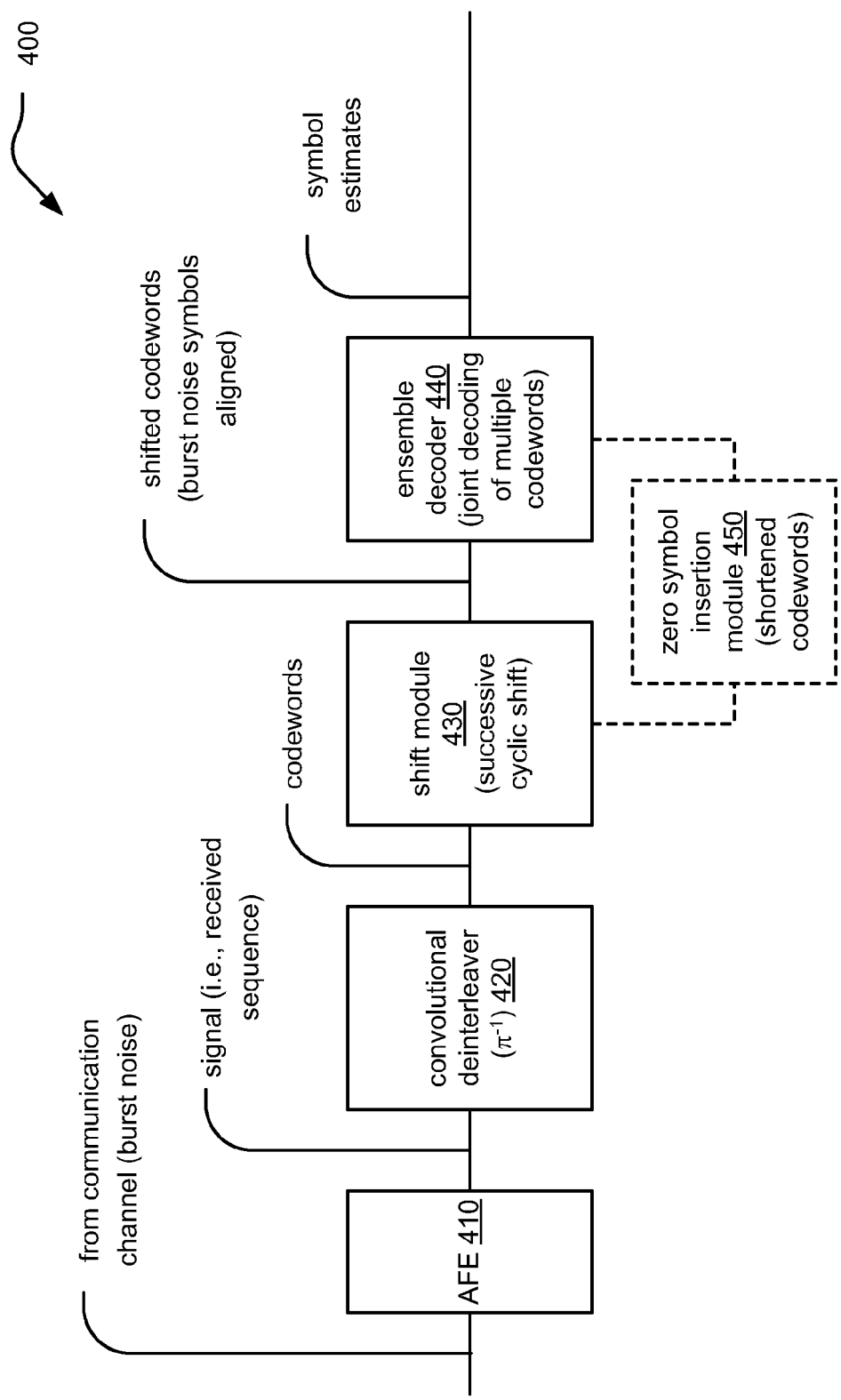

Referring to the apparatus 400 in FIG. 4, this embodiment is somewhat analogous to the previous embodiment with at least one difference being that that any type of coded signal may be processed herein (e.g., not solely a RS coded signal). The various comments made above with respect to FIG. 3 (e.g., synchronization, various interleaver and shifting parameters, etc.) are also applicable here.

For example, any of a variety of coded signals may benefit from the processing and operations described herein. For example, the coded signal received from a communication channel may be a BCH (Bose and Ray-Chaudhuri) coded signal as generated using a BCH code, an LDPC (Low Density Parity Check) code, or any other ECC as may be desired in a particular embodiment.

The apparatus 400 may be any of a variety of types of communication devices including a transceiver or a receiver type of communication device. The apparatus receives a signal from a communication channel and processes it initially using an analog front end (AFE) 410. As described above with other embodiments, the AFE 410 can perform any of a variety of necessary operations to convert a signal received from the communication channel to a digital signal (e.g., a sequence of discrete-valued symbols and/or codewords) such as within a baseband signal. The AFE 310 can perform any necessary or desired operations of frequency shifting, filtering (analog and/or digital), digital sampling (such as within an analog to digital converter (ADC), gain adjustment, and/or any other appropriate processing.

The signal output from the AFE 410 is provided to a convolutional deinterleaver 420 (depicted also using $\pi^{-1}$ in the diagram) that deinterleaves the received signal. The communication channel is a burst noise affected communication channel. The convolutional deinterleaver 420 then outputs a first plurality of codewords. A shift module 430 then cyclically shifts successive codewords received from the convolutional deinterleaver 420.

The cyclic shifting is performed by successively and uniformly increasing or decreasing numbers of symbols thereby generating a second plurality of codewords such that at least some of the second plurality of codewords have burst noise affected symbols in common symbol locations. The shifting as performed by the shift module 430 ensures that burst noise affected symbols of various codewords are arranged such that at least some common symbol locations include burst noise affected symbols. For example, at least two codewords have burst noise affected symbols in common symbol locations.

It is noted that when extended codewords are employed (e.g., the first plurality of codewords includes extended codewords), then the shift module 430 cyclically shifts only the non-extended symbols within the extended codewords.

An ensemble decoder (e.g., an ensemble BCH decoder when processing a BCH coded signal) jointly decodes multiple codewords during a same time period (i.e., processes multiple codewords simultaneously). By processing multiple codewords simultaneously, the ensemble decoder 440 has greater error correction capability than a traditional decoder that processes a single codeword at a time. In one embodiment, this may be performed as described in U.S. Provisional Application Ser. No. 61/264,613, entitled "Modified error distance decoding for achieving improved performance in additive white Gaussian noise (AWGN) and burst events with interleaving," filed Nov. 25, 2009, pending, that is claimed priority to and incorporated by reference above. The ensemble decoder 440 then outputs symbol estimates corresponding to the multiple codewords.

Again, when pre-shifting is not performed within a transmitting communication device (e.g., the communication device does not include shift module 222a in transmitter 297 of FIG. 2), then a shift module (e.g., shift module 570 in FIG. 5 or shift module 670 in FIG. 6) is employed which is complementary to the receiver shift module (e.g., shift module 222b in receiver 298 of FIG. 2). Such a complementary shift module may be implemented after the decoder (e.g., after decoder 280 in receiver 298 of FIG. 2). Again, the complementary operation of such two shift modules may also be described with reference to the embodiments of FIG. 5 and FIG. 6.

In some embodiments in which the transmitting communication device does not include a shift module (e.g., does not include shift module 222a in transmitter 297 of FIG. 2), a zero symbol insertion module 450 is interposed in between the shift module 430 and the ensemble decoder 440. This zero symbol insertion module 450 may be implemented to accommodate shortened codewords that may have been transmitted from a transmitting communication device that launches the signal into the communication channel from which the apparatus 400 receives that same signal. For example, the first plurality of codewords may be shortened codewords. The zero symbol insertion module 450, interposed between the shift module 430 and the ensemble decoder 440, inserts zero-valued symbols into the second plurality of codewords in accordance with a shortening parameter by which the shortened codewords are generated.

In alternative embodiments in which no zero symbol insertion module 450 is implemented and in which shortened codewords are employed, the ensemble decoder 440 can itself account for zero-valued symbols, in predetermined locations within the second plurality of codewords, in accordance with a shortening parameter by which the shortened codewords are generated.

The apparatus 400 may be viewed as being one communication device located at one end of the burst noise affected communication channel, and another communication device may be located at the other end of the burst noise affected communication channel (e.g., a second/transmitter communication device that communicates with apparatus 400). The second communication device located at the second end of the burst noise affected communication channel may include an encoder and a convolutional interleaver.

Of course, analogous and complementary to the AFE 410, the second communication device may also include a corresponding AFE that performs any necessary or desired operations of frequency shifting, filtering (analog and/or digital), analog conversion (such as within a digital to analog converter (DAC), gain adjustment, and/or any other appropriate processing to generate a signal to be launched into the communication channel).

Figure 5:
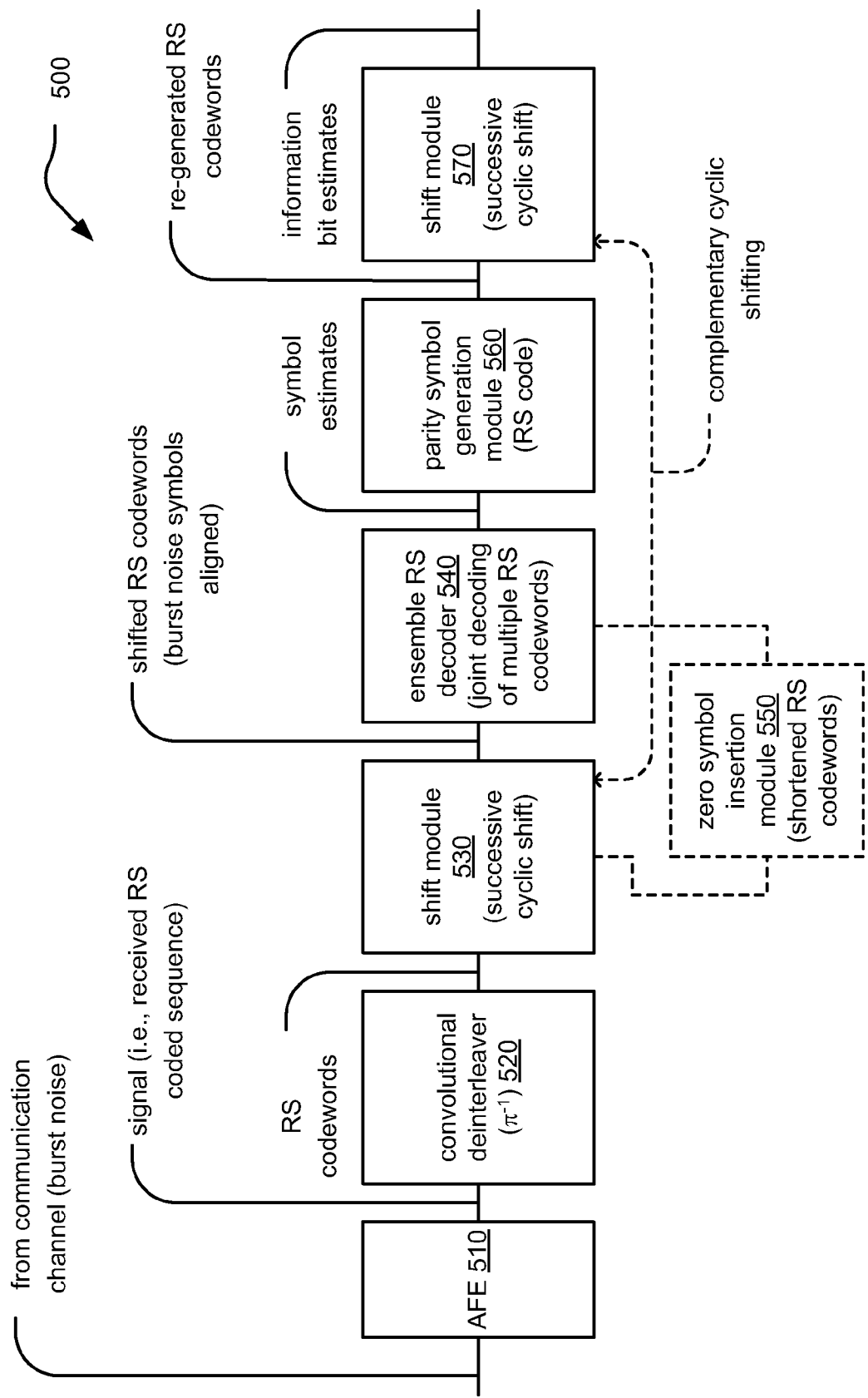

Referring to the apparatus 500 in FIG. 5, this embodiment has some similarities to the apparatus 300 of FIG. 3 (e.g., FIG. 5 includes an AFE 510, a convolutional deinterleaver 520 (depicted also using $\pi^{-1}$ in the diagram), a shift module 530, and an ensemble RS decoder 540, while some embodiments include a zero symbol insertion module 550 when RS shortened codewords are employed), but after the ensemble RS decoder 540 is a parity symbol generation module 560 that operates to regenerate the parity symbols as generated by the corresponding RS code. The parity symbol generation module 560 generates a plurality of parity symbols corresponding to the plurality of symbol estimates which, when combined with the plurality of symbol estimates, thereby form a third plurality of RS codewords. Also, another shift module 570 cyclically shifts successive RS codewords of the third plurality of RS codewords by successively and uniformly decreasing or increasing numbers (indices) of symbols [keeping in mind that some embodiments will have various groups of α codewords being shifted by same amounts] thereby generating a fourth plurality of RS codewords that includes a plurality of estimates of information bits encoded within the signal. In certain embodiments, the shift module 530 and the shift module 570 perform complementary cyclical shifting with respect to each other (e.g., a positive shifting by a given amount in shift module 530 incurs a negative shifting by that given amount in shift module 570, or vice versa).

Figure 6:
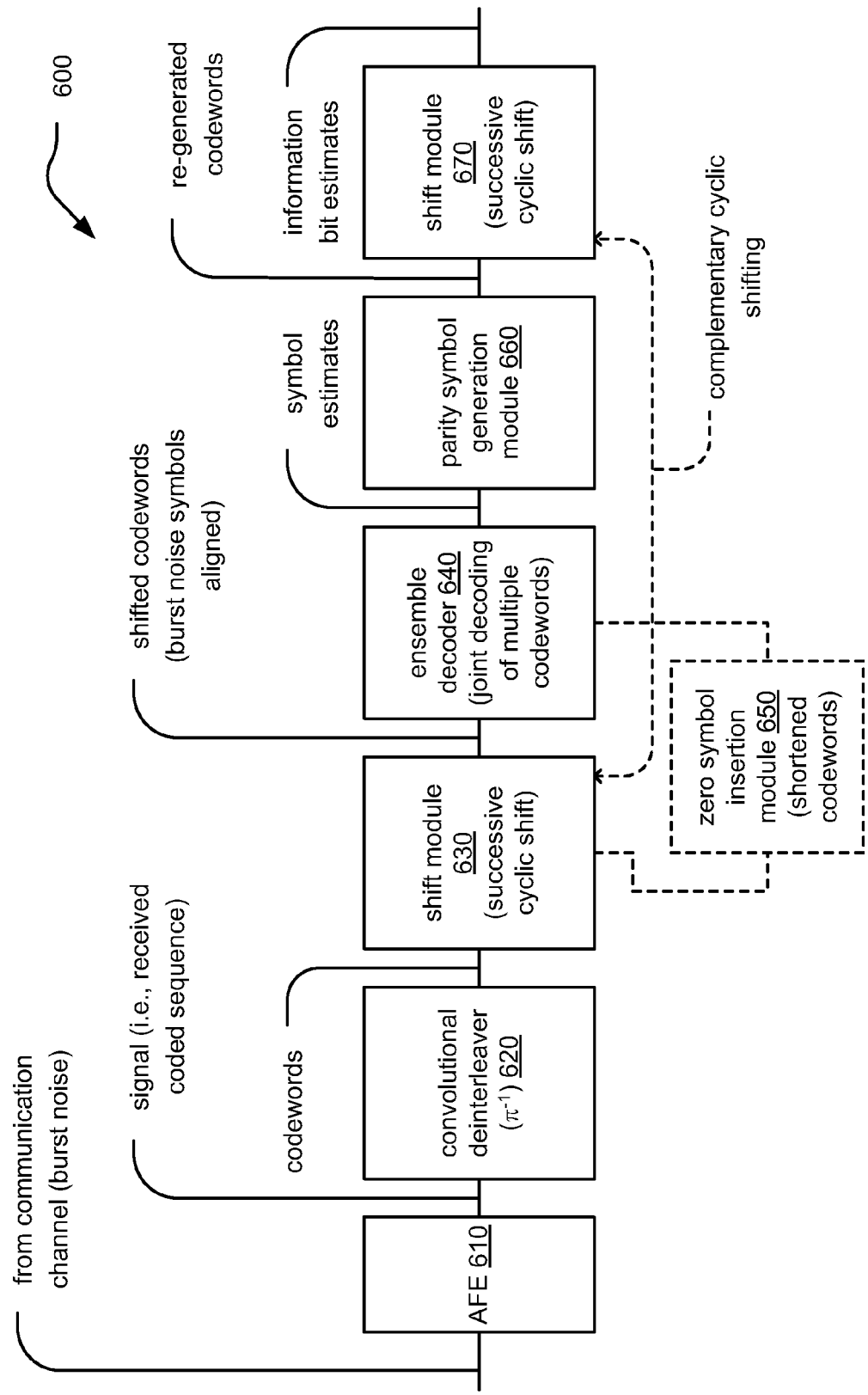

Referring to the apparatus 600 in FIG. 6, this embodiment has some similarities to the apparatus 400 of FIG. 4 (e.g., FIG. 6 includes an AFE 610, a convolutional deinterleaver 620 (depicted also using $\pi^{-1}$ in the diagram), a shift module 630, and an ensemble decoder 640, while some embodiments include a zero symbol insertion module 650 when shortened codewords are employed), but after the ensemble decoder 640 is a parity symbol generation module 660 that operates to regenerate the parity symbols as generated by the corresponding code (e.g., BCH code or other code by which the signal is encoded and generated). The parity symbol generation module 660 generates a plurality of parity symbols corresponding to the plurality of symbol estimates which, when combined with the plurality of symbol estimates, thereby form a third plurality of codewords. Also, another shift module 670 cyclically shifts successive codewords of the third plurality of codewords by successively and uniformly decreasing or increasing numbers (indices) of symbols [keeping in mind that some embodiments will have various groups of a codewords being shifted by same amounts] thereby generating a fourth plurality of codewords that includes a plurality of estimates of information bits encoded within the signal. In certain embodiments, the shift module 630 and the shift module 670 perform complementary cyclical shifting with respect to each other (e.g., a positive shifting by a given amount in shift module 630 incurs a negative shifting by that given amount in shift module 670, or vice versa).

Figure 7:
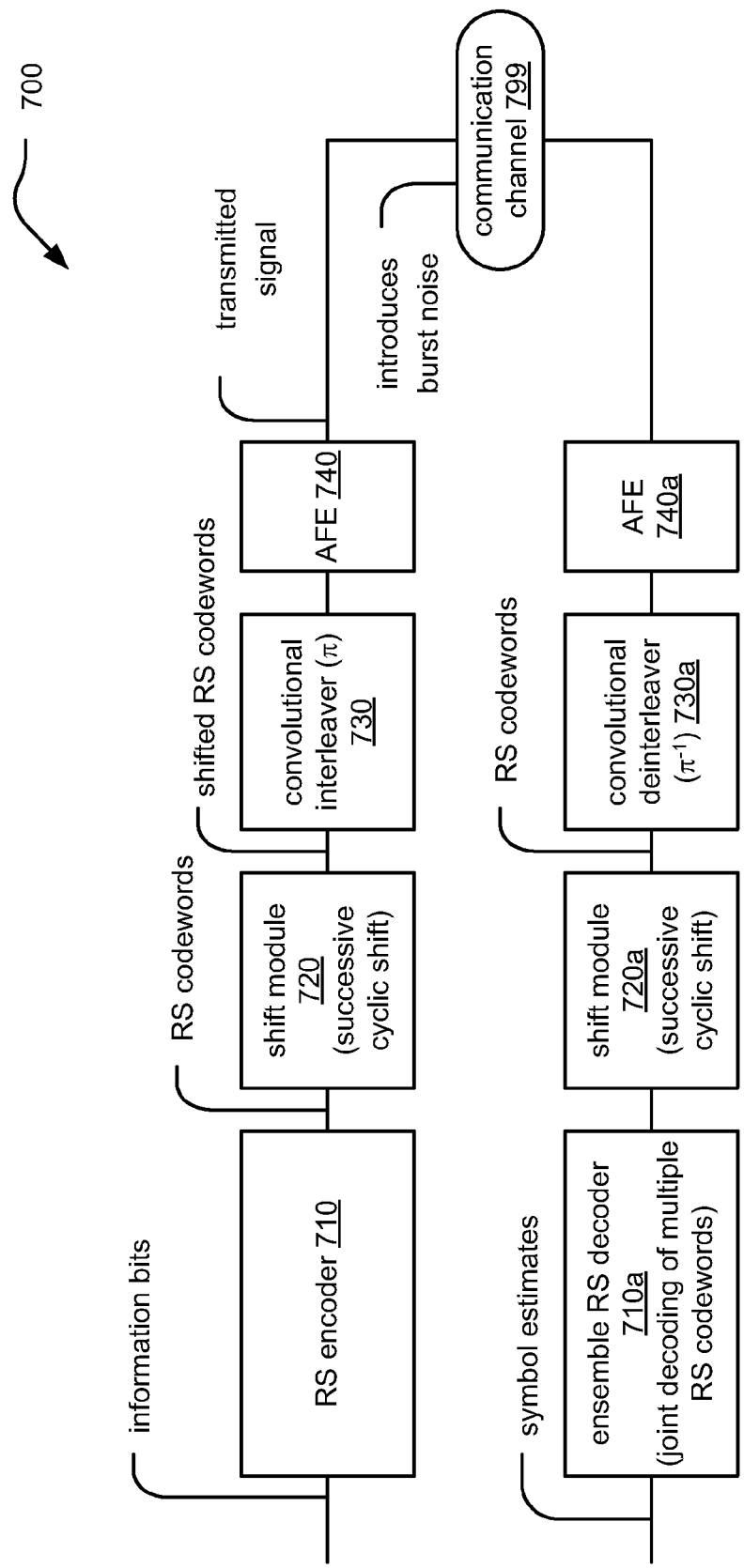
FIG. 7 and FIG. 8 illustrate various embodiments of communication systems.
Figure 8:
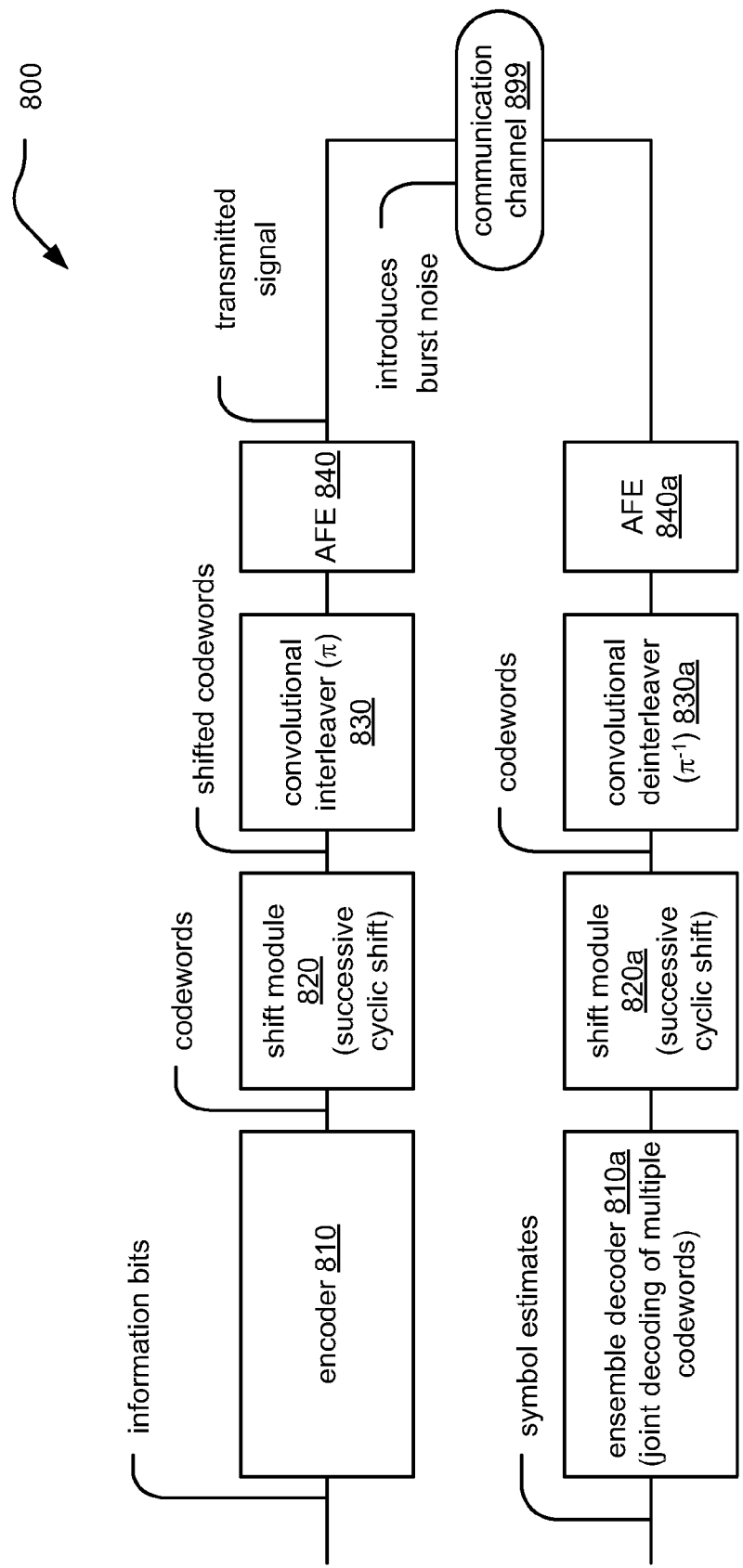

FIG. 7 and FIG. 8 illustrate various embodiments of communication systems 700 and 800, respectively.

For standard length cyclic Reed-Solomon (RS) codewords, the cyclic shifting that may be performed on a signal output from a convolutional deinterleaver aligns the burst noise affected symbols within various codewords that are provided to an ensemble decoder. This allows the identification of P symbol locations (or approaching P symbol locations) which contain the symbol errors among a set of M codewords. For example, in one embodiments, these operations may be performed in a suitable processor such as described in U.S. Provisional Application Ser. No. 61/264,613, entitled "Modified error distance decoding for achieving improved performance in additive white Gaussian noise (AWGN) and burst events with interleaving," filed Nov. 25, 2009, pending, that is claimed priority to and incorporated by reference above. The error location solution will identify the P error locations out of N.

However, it is pointed out that the K information symbols are now located differently with respect to the N symbols of each codeword. However, this is not problematic. It is noted that pre-shifting of the RS codewords within a transmitter communication device prior to performing convolutional interleaving, in the direction opposite of the cyclic shifting that will eventually be performed within a receiver communication device, will provide that the alignment of the K information symbols within the RS codewords is corrected to the standard location when both the pre-shifting in the transmitter communication device and the counter-shifting in the receiver communication device are provided.

In the application of pre-shifting (at the encoder/interleaver in the transmitter communication device) and counter-shifting (at the decoder/deinterleaver in the receiver communication device), the burst noise affected symbols are aligned into the same positions across all codewords, and the K information symbols are all in their standard locations at the convolutional deinterleaver. In such an instance, there is no need for zero insertion (prior to shifting at the receiver) for shortened codewords and there is no need for withholding shifting on extended symbols, when pre-shifting is applied at the transmitter. In fact, no cyclic property of the code itself is needed at all when pre-shifting is applied at the transmitter.

Referring to the communication system 700 in FIG. 7, a Reed-Solomon (RS) encoder 710 encodes a plurality of information bits thereby generating a first plurality of RS codewords. Thereafter, a first shift module 720 cyclically shifts successive RS codewords of the first plurality of RS codewords by successively and uniformly increasing or decreasing numbers of symbols thereby generating a second plurality of RS codewords. Then, a convolutional interleaver 730 interleaves the second plurality of RS codewords thereby generating a signal that is launched into a communication channel, wherein the signal incurs burst noise during transmission via the communication channel. As within other embodiments, an AFE 740 may be implemented to generate a signal that gets launched into a communication channel 799 that introduces burst noise.

At the other end of the communication channel 799, an AFE 740a processes the received signal to generate a digital signal there from (e.g., a baseband signal). A convolutional deinterleaver 730a then deinterleaves the signal output from the AFE 740a thereby generating a third plurality of RS codewords. A second shift module 720a then cyclically shifts successive RS codewords of the third plurality of RS codewords complementarily to the cyclical shifting performed by the first shift module such that at least some of the third plurality of RS codewords have burst noise affected symbols in common symbol locations. Then, an ensemble RS decoder 710a jointly decodes the third plurality of RS codewords thereby generating a plurality of symbol estimates corresponding to the plurality of information bits.

Referring to the communication system 800 in FIG. 8, this embodiment is somewhat analogous to the previous embodiment with at least one difference being that that any type of coded signal may be processed herein (e.g., not solely a RS coded signal). For example, any of a variety of coded signals may benefit from the processing and operations described herein. For example, the coded signal received from a communication channel may be a BCH (Bose and Ray-Chaudhuri) coded signal as generated using a BCH code, an LDPC (Low Density Parity Check) code, or any other ECC as may be desired in a particular embodiment.

Again referring to the communication system 800 in FIG. 8, an encoder 810 (e.g., a BCH encoder or an encoder employing another type of ECC) encodes a plurality of information bits thereby generating a first plurality of codewords. Thereafter, a first shift module 820 cyclically shifts successive codewords of the first plurality of codewords by successively and uniformly increasing or decreasing numbers of symbols thereby generating a second plurality of codewords. Then, a convolutional interleaver 830 interleaves the second plurality of codewords thereby generating a signal that is launched into a communication channel, wherein the signal incurs burst noise during transmission via the communication channel. As within other embodiments, an AFE 840 may be implemented to generate a signal that gets launched into a communication channel 899 that introduces burst noise.

At the other end of the communication channel 899, an AFE 840a processes the received signal to generate a digital signal there from (e.g., a baseband signal). A convolutional deinterleaver 830a then deinterleaves the signal output from the AFE 840a thereby generating a third plurality of codewords. A second shift module 820a then cyclically shifts successive codewords of the third plurality of codewords complementarily to the cyclical shifting performed by the first shift module such that at least some of the third plurality of codewords have burst noise affected symbols in common symbol locations. Then, an ensemble decoder 810a jointly decodes the third plurality of codewords thereby generating a plurality of symbol estimates corresponding to the plurality of information bits.

Figure 9:
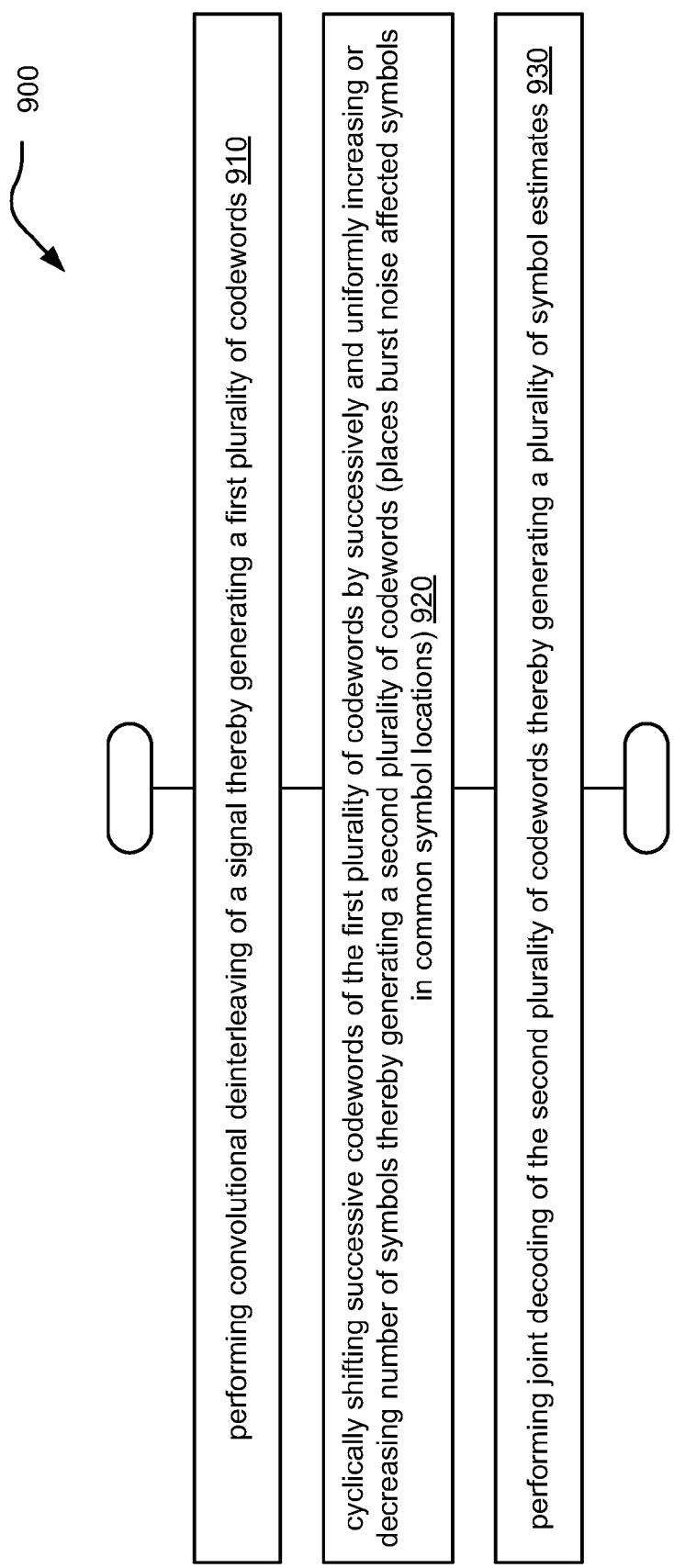
FIG. 9 and FIG. 10 illustrate various embodiments of methods for processing of a signal received from a communication channel
Figure 10:
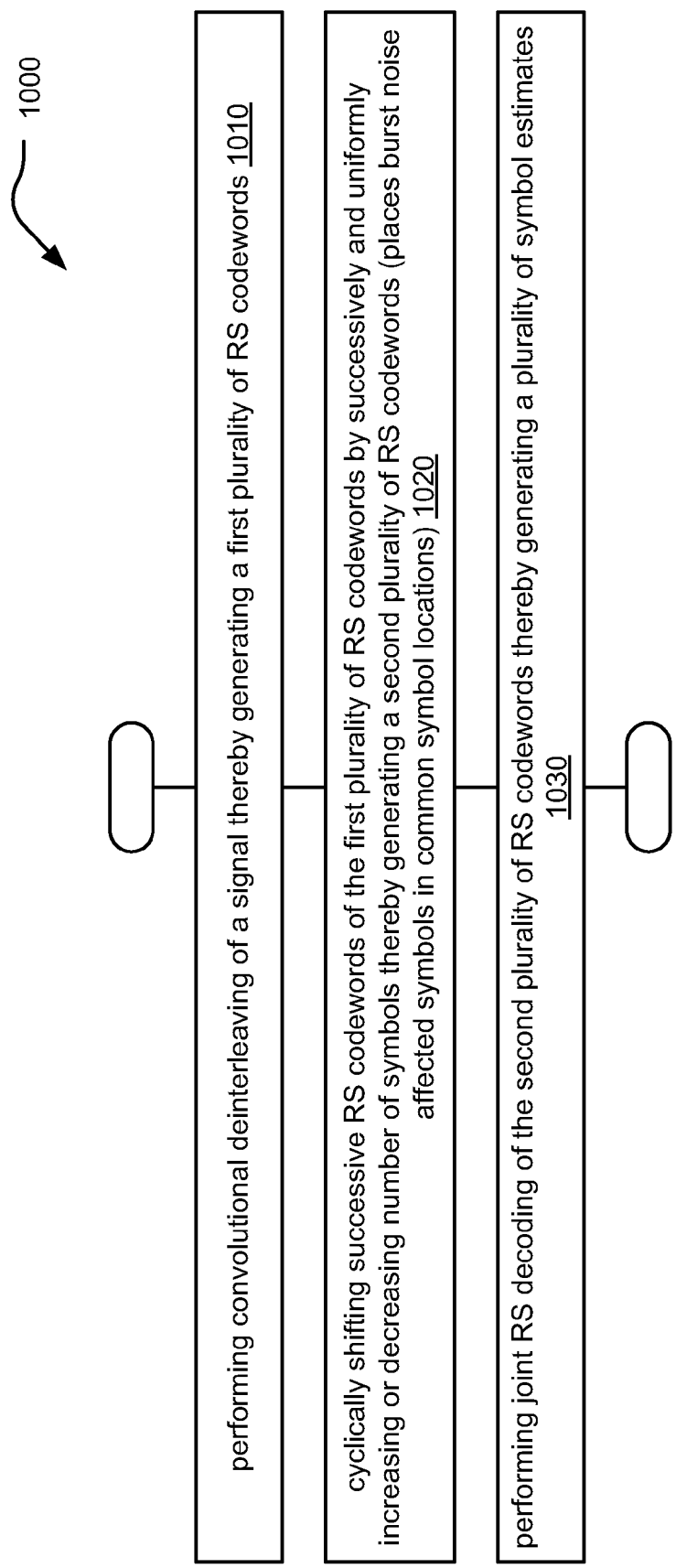

FIG. 9 and FIG. 10 illustrate various embodiments of methods for processing of a signal received from a communication channel.

Referring to the method 900 in FIG. 9, the method operates by performing convolutional deinterleaving of a signal thereby generating a first plurality of codewords, as shown in a block 910. Then, the method 900 operates by cyclically shifting successive codewords of the first plurality of codewords by successively and uniformly increasing or decreasing number of symbols thereby generating a second plurality of codewords (places burst noise affected symbols in common symbol locations), as shown in a block 920. The method 900 continues by performing joint decoding of the second plurality of codewords thereby generating a plurality of symbol estimates, as shown in a block 930.

Referring to the method 1000 in FIG. 10, the method operates by performing convolutional deinterleaving of a signal thereby generating a first plurality of RS codewords, as shown in a block 1010. Then, the method 1000 operates by cyclically shifting successive RS codewords of the first plurality of RS codewords by successively and uniformly increasing or decreasing number of symbols thereby generating a second plurality of RS codewords (places burst noise affected symbols in common symbol locations), as shown in a block 1020. The method 1000 continues by performing joint RS decoding of the second plurality of RS codewords thereby generating a plurality of symbol estimates, as shown in a block 1030.

Figure 11:
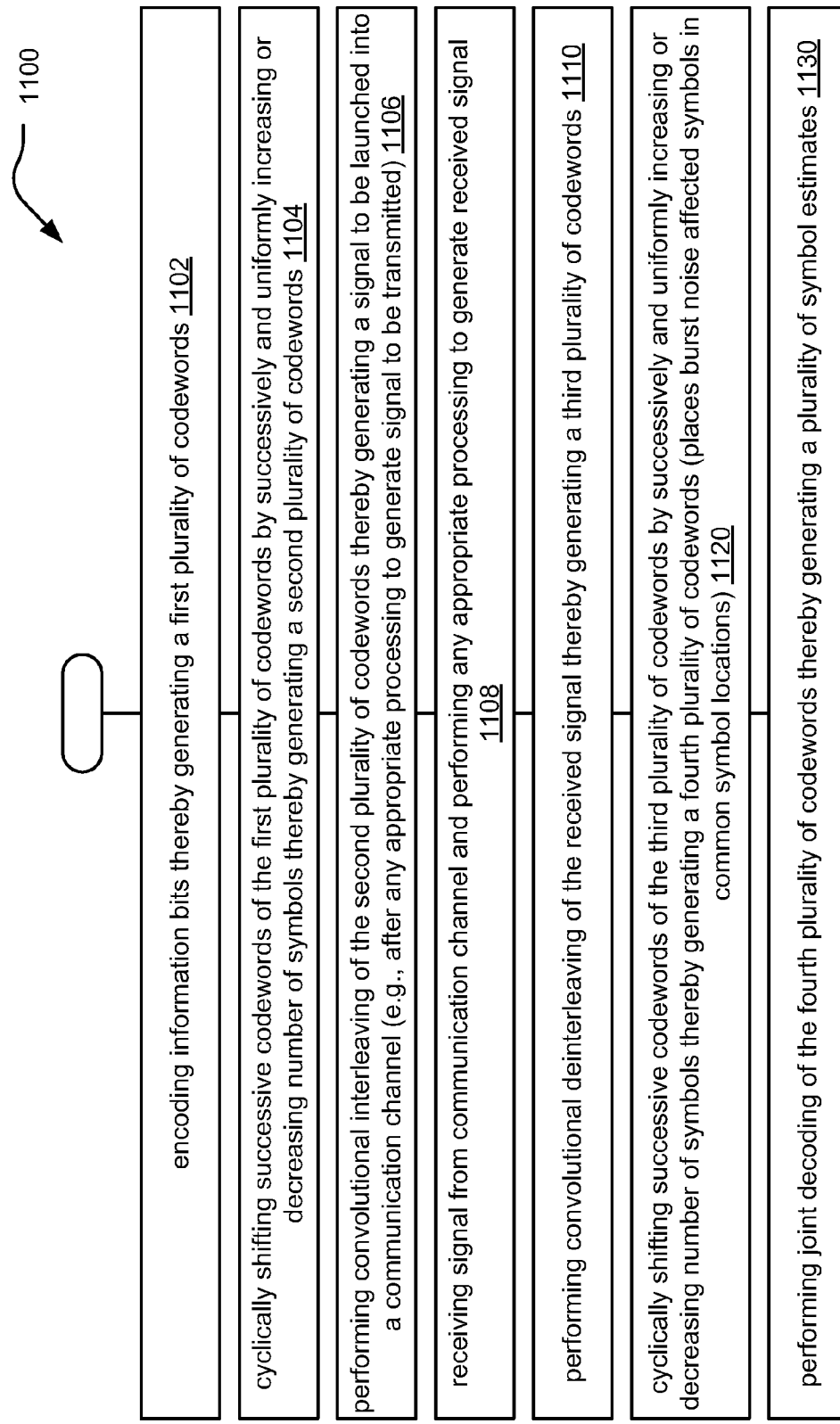
FIG. 11 and FIG. 12 illustrate various embodiments of methods for processing of a signal to be transmitted into and received from a communication channel.

FIG. 11 and FIG. 12 illustrate various embodiments of methods 1100 and 1200, respectively, for processing of a signal to be transmitted into and received from a communication channel. These embodiments deal with instances where shifting is performed within a transmitting communication device and also complementary in the receiving communication device.

Referring to method 1100 of FIG. 11, the method 1100 begins by encoding information bits thereby generating a first plurality of codewords, as shown in a block 1102. The method 1100 continues by cyclically shifting successive codewords of the first plurality of codewords by successively and uniformly increasing or decreasing number of symbols thereby generating a second plurality of codewords, as shown in a block 1104. The method 1100 then operates by performing convolutional interleaving of the second plurality of codewords thereby generating a signal to be launched into a communication channel (e.g., after any appropriate processing to generate signal to be transmitted), as shown in a block 1106. The method 1100 continues by receiving signal from communication channel and performing any appropriate processing to generate received signal, as shown in a block 1108.

The method 1100 continues by performing convolutional deinterleaving of the received signal thereby generating a third plurality of codewords, as shown in a block 1110. The method 1100 continues by cyclically shifting successive codewords of the third plurality of codewords by successively and uniformly increasing or decreasing number of symbols thereby generating a fourth plurality of codewords (places burst noise affected symbols in common symbol locations), as shown in a block 1120. The method 1100 then operates by performing joint decoding of the fourth plurality of codewords thereby generating a plurality of symbol estimates, as shown in a block 1130.

Referring to method 1200 of FIG. 12, the method 1200 begins by encoding information bits thereby generating a first plurality of RS codewords, as shown in a block 1202. The method 1200 continues by cyclically shifting successive RS codewords of the first plurality of RS codewords by successively and uniformly increasing or decreasing number of symbols thereby generating a second plurality of RS codewords, as shown in a block 1204. The method 1200 then operates by performing convolutional interleaving of the second plurality of RS codewords thereby generating a signal to be launched into a communication channel (e.g., after any appropriate processing to generate signal to be transmitted), as shown in a block 1206.

The method 1200 continues by receiving signal from communication channel and performing any appropriate processing to generate received signal, as shown in a block 1208. The method 1200 continues by performing convolutional deinterleaving of a signal thereby generating a first plurality of RS codewords, as shown in a block 1210. The method 1200 continues by cyclically shifting successive RS codewords of the first plurality of RS codewords by successively and uniformly increasing or decreasing number of symbols thereby generating a second plurality of RS codewords (places burst noise affected symbols in common symbol locations), as shown in a block 1220. The method 1200 then operates by performing joint RS decoding of the second plurality of RS codewords thereby generating a plurality of symbol estimates, as shown in a block 1230.

FIG. 13 illustrates an embodiment 1300 of convolutional interleaving and deinterleaving. As can be seen, symbols are input to the convolutional interleaver ($\pi$) 1310 on the left hand side of the diagram. A first symbol is passed directly out to a communication channel 1399, a second symbol undergoes a delay of a value of Y and is then passed to the communication channel 1399. This processing continues so that each successive symbol is delayed by increasing amounts of time.

Analogously, at the other end of the communication channel 1399 is a convolutional deinterleaver ($\pi^{-1}$) 1310 on the right hand side of the diagram and performs the complementary processing of the convolutional interleaver ($\pi$) 1310.

In accordance with convolutional interleaving and convolutional deinterleaving, a burst noise event within the communication channel 1399 will affect symbols of various codewords. By performing the appropriate shifting within a transmitter communication device and/or a receiver communication device as described herein, burst noise affected symbols of various codewords become aligned so that an ensemble decoder jointly processes multiple codewords simultaneously to generate estimates of the symbols (and the corresponding bits) included therein.

Figure 14:
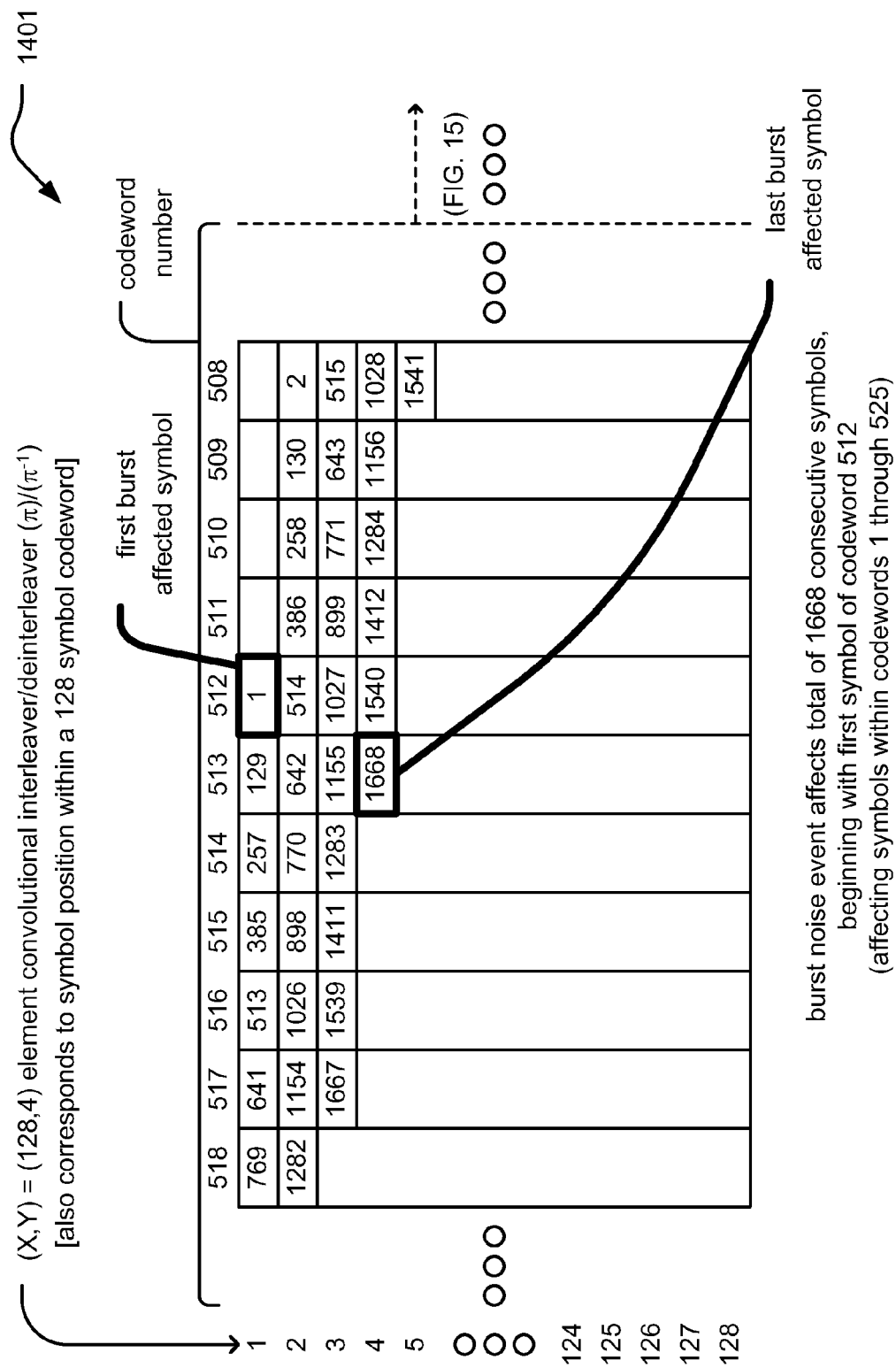
FIG. 14 and FIG. 15, conjunctively, illustrate an embodiment of burst noise affected symbols spanning across multiple codewords.
Figure 15:
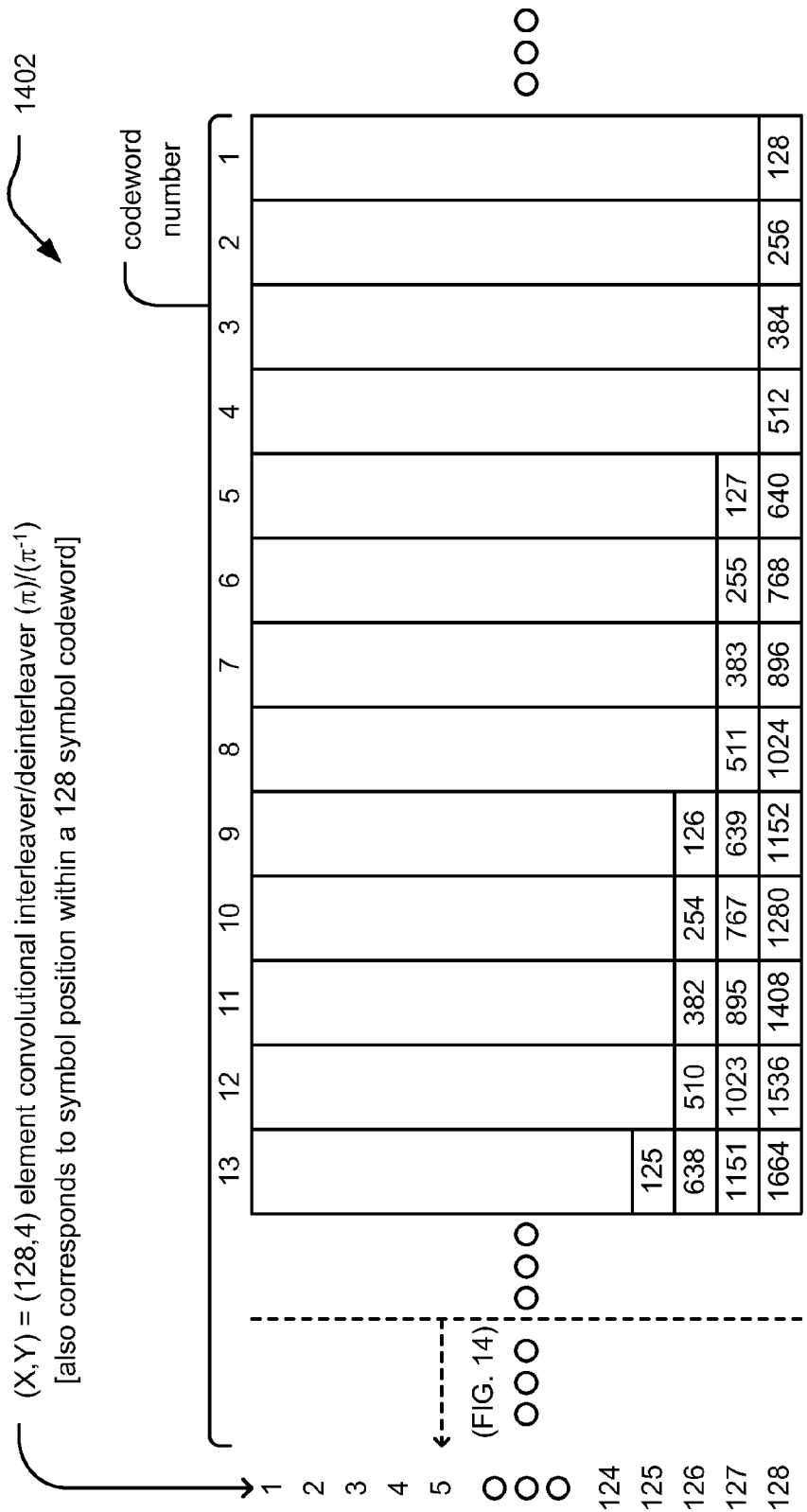

FIG. 14 and FIG. 15, conjunctively, illustrate an embodiment 1401/1402 (shown conjunctively by reference numerals 1401 and 1402) of burst noise affected symbols spanning across multiple codewords. FIG. 14 shows codewords 508 to 518, and FIG. 15 shows codewords 1 to 13.

This embodiment 1401/1402 shows a specific embodiment employing a convolutional interleaver/deinterleaver (128, 4) such that X=128 and Y=4. In other words, the codewords are composed of 128 symbols each. As can be seen, this embodiment 1401/1402 includes 1668 consecutive burst affected symbols. Within the codewords that are received, the first burst affected symbol is located in the codeword #512, and the last burst affected symbol is located in the codeword #513. This embodiment 1401/1402 shows burst effected symbols within each of codewords 1 through 525.

FIG. 16 and FIG. 17 illustrate various embodiments of burst noise affected symbols spanning across multiple codewords.

FIG. 16 illustrates an interleaver with the number of branches, m (where m=X with reference to FIG. 13), which is a fraction of the codeword length, N. This results in each codeword requiring q>1 columns in FIG. 16 as the symbols are assembled from the deinterleaver.

Referring to the embodiment 1600 in FIG. 16, as can be seen in this diagram, p+m+3 (where p and m are integers, and where p=q×m+1) consecutive symbols are affected in a burst noise event, and those symbols are spread across multiple codewords as can be seen when the codewords are output from a convolutional deinterleaver ($\pi^{-1}$). A first burst noise affected symbol is shown as being in codeword m, a second burst noise affected symbol is shown as being in codeword m−1, a third burst noise affected symbol is shown as being in codeword m−2, and so on. Because the convolutional deinterleaver ($\pi$)/interleaver ($\pi^{-1}$) is an m element device, an m-th burst noise affected symbol is shown as being in codeword 1, and then the burst noise affected symbols wrap around again to codeword m (that also includes an m+1-th burst noise affected symbol). An m+2-th burst noise affected symbol is included in codeword m−1.

Referring to the embodiment 1700 in FIG. 17, as can be seen in this diagram, only m+2 (where m is an integer) consecutive symbols are affected in a burst noise event, and those symbols are spread across multiple codewords as can be seen when the codewords are output from a convolutional deinterleaver ($\pi^{-1}$). A first burst noise affected symbol is shown as being in codeword m, a second burst noise affected symbol is shown as being in codeword m−1, a third burst noise affected symbol is shown as being in codeword m−2, and so on. As with the previous embodiment, because the convolutional deinterleaver ($\pi$)/interleaver ($\pi^{-1}$) is an m element device, an m-th burst noise affected symbol is shown as being in codeword 1, and then the burst noise affected symbols wrap around again to codeword m (that also includes an m+1-th burst noise affected symbol). An m+2 burst noise affected symbol is included in codeword m−1. No additional symbols are included within the burst noise event that affects the signal in this embodiment.

Figure 18A:
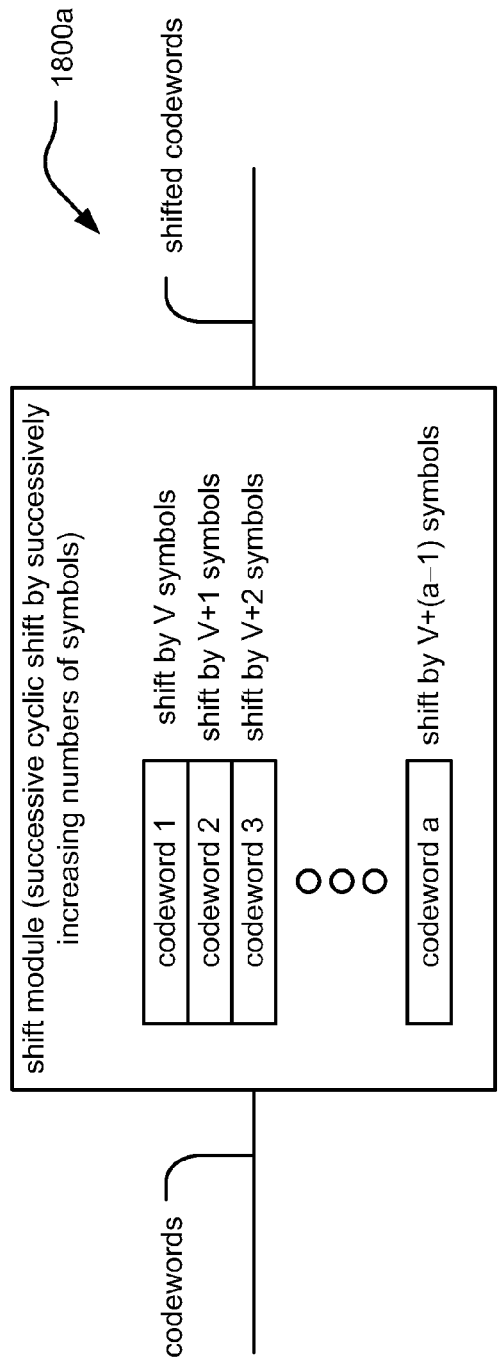
FIG. 18A and FIG. 18B illustrate various embodiments of successive cyclic shifting of symbols within multiple codewords.
Figure 18B:
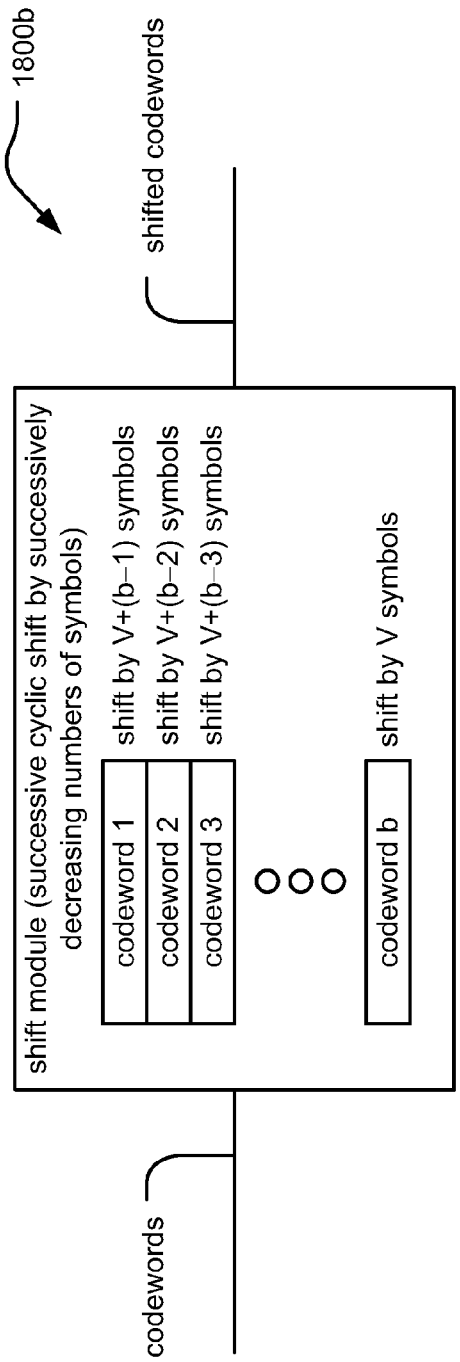

FIG. 18A and FIG. 18B illustrate various embodiments of successive cyclic shifting of symbols within multiple codewords.

Referring to the embodiment 1800a in FIG. 18A, codewords are received by a shift module that performs a successive cyclic shift by successively increasing numbers of symbols thereby generating shifting codewords. For example, a codeword 1 is shifted by a value of V symbols (where V is an integer). Each successive codeword is shifted by a uniformly increasing number of symbols. For example, a codeword 2 is shifted by a value of V+1 symbols, a codeword 3 is shifted by a value of V+2 symbols, and so on until a codeword a (a is an integer) is shifted by a value of V+(a−1) symbols.

Alternatively, each successive shift need not be by only a difference of one symbol each (e.g., by V, V+1, V+2, etc.). The cyclic shifting of successive codewords of uniformly increasing number of symbols may be by different values (e.g., by V, V+2, V+4, etc. or V, V+3, V+6, etc.). Alternatively, there may be situations where groups of codewords all get shifted by a same respective amount (e.g., all codewords of a first group of codewords shifted by a first amount, all codewords of a second group of codewords shifted by a second amount, etc).

Referring to the embodiment 1800b in FIG. 18B, codewords are received by a shift module that performs a successive cyclic shift by successively decreasing numbers of symbols thereby generating shifting codewords. For example, a codeword 1 is shifted by a value of V+(b−1) symbols (where V and b are integers). Each successive codeword is shifted by a uniformly decreasing number of symbols. For example, a codeword 2 is shifted by a value of V+(b−2) symbols, a codeword 3 is shifted by a value of V+(b−3) symbols, and so on until a codeword b (b is an integer) is shifted by a value of V symbols.

Alternatively, each successive shift need not be by only a difference of one symbol each (e.g., by V+(b−1), V+(b−2), V+(b−3), etc.). The cyclic shifting of successive codewords of uniformly decreasing number of symbols may be by different values (e.g., by V+(b−1), V+(b−3), V+(b−5), etc. or V+(b−1), V+(b−4), V+(b−7), etc.). Again, alternatively, there may be situations where groups of codewords all get shifted by a same respective amount (e.g., all codewords of a first group of codewords shifted by a first amount, all codewords of a second group of codewords shifted by a second amount, etc).

It is noted that various aspects of the invention may be applied to single carrier modulations including continuous and burst communications, such as time division multiplexing (TDM) and time division multiple access (TDMA), and modulations such as code division multiple access (CDMA), synchronous-CDMA (S-CDMA), orthogonal frequency division multiplexing (OFDM), and similar modulations which employ symbols traversing a channel in parallel. In the latter modulation examples, a single disturbance or event may degrade more than one symbol at one time, and this may be viewed as being a burst event. The teachings presented herein apply beneficially to such modulations and burst events as well as single-carrier modulations.

In addition, it is noted that the various modules (e.g., encoding modules, decoding modules, shift modules, interleavers, deinterleavers, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a communication interface to receive a signal from a burst noise affected communication channel;
a convolutional deinterleaver to deinterleaver the signal to generate a first plurality of Reed-Solomon(RS) codewords;
a shift module to shift cyclically successive RS codewords of the first plurality of RS codewords by successively and uniformly increasing or decreasing numbers of symbols to generate a second plurality of RS codewords such that at least some of the second plurality of RS codewords have burst noise affected symbols in common symbol locations; and
an ensemble RS decoder to decode jointly the second plurality of RS codewords to generate a plurality of symbol estimates.

2. The apparatus of claim 1, further comprising:
a parity symbol generation module to generate a plurality of parity symbols corresponding to the plurality of symbol estimates which, when combined with the plurality of symbol estimates, thereby form a third plurality of RS codewords; and
at least one additional shift module to shift cyclically successive RS codewords of the third plurality of RS codewords by successively and uniformly decreasing or increasing numbers of symbols to generate a fourth plurality of RS codewords that includes a plurality of estimates of information bits encoded within the signal.

3. The apparatus of claim 2, wherein:
the shift module and the at least one additional shift module perform complementary cyclical shifting with respect to each other.

4. The apparatus of claim 1, further comprising:
an input to receive a RS and convolutional interleaved coded signal from the burst noise affected communication channel; and
a front-end module to process the RS and convolutional interleaved coded signal to generate the signal; and wherein:
the RS and convolutional interleaved coded signal incurs burst noise within the burst noise affected communication channel.

5. The apparatus of claim 1, wherein:
the apparatus is a first communication device located at a first end of the burst noise affected communication channel; and further comprising:
a second communication device, located at a second end of the burst noise affected communication channel, that includes:
 a RS encoder to employ a cyclic RS code to encode the information bits; and
 a convolutional interleaver to interleave the RS-encoded information bits to generate the signal.

6. The apparatus of claim 1, wherein:
the first plurality of RS codewords includes shortened RS codewords.

7. The apparatus of claim 6, further comprising:
a zero symbol insertion module, interposed between the shift module and the ensemble RS decoder, to insert zero-valued symbols into the second plurality of RS codewords in accordance with a shortening parameter by which the shortened RS codewords are generated.

8. The apparatus of claim 6, wherein:
the ensemble RS decoder to account for zero-valued symbols, in predetermined locations within the second plurality of RS codewords, in accordance with a shortening parameter by which the shortened RS codewords are generated.

9. The apparatus of claim 1, wherein:
the first plurality of codewords includes extended RS codewords; and
the shift module to shift cyclically only the non-extended RS symbols within the extended RS codewords.

10. The apparatus of claim 1, wherein:
the apparatus is a communication device; and
the communication device is a transceiver or a receiver.

11. The apparatus of claim 1, wherein:
the apparatus is communication device that includes an analog front end therein to effectuate communications within at least one of a satellite communication system, a wireless communication system, a wired communication system, and a fiber-optic communication system.

12. An apparatus, comprising:
a communication interface to receive a signal from a burst noise affected communication channel;
a convolutional deinterleaver to deinterleave the signal to generate a first plurality of codewords;
a shift module to shift cyclically successive codewords of the first plurality of codewords by successively and uniformly increasing or decreasing numbers of symbols to generate a second plurality of codewords such that at least some of the second plurality of codewords have burst noise affected symbols in common symbol locations; and
an ensemble decoder to decode jointly the second plurality of codewords to generate a plurality of symbol estimates.

13. The apparatus of claim 12, wherein:
the first plurality of codewords is a first plurality of BCH (Bose and Ray-Chaudhuri) codewords; and
the ensemble decoder is an ensemble BCH decoder.

14. The apparatus of claim 12, further comprising:
a parity symbol generation module to generate a plurality of parity symbols corresponding to the plurality of symbol estimates which, when combined with the plurality of symbol estimates, thereby form a third plurality of codewords; and
at least one additional shift module to shift cyclically successive codewords of the third plurality of codewords by successively and uniformly decreasing or increasing numbers of symbols to generate a fourth plurality of codewords that includes a plurality of estimates of information bits encoded within the signal.

15. The apparatus of claim 14, wherein:
the shift module and the at least one additional shift module perform complementary cyclical shifting with respect to each other.

16. The apparatus of claim 12, wherein:
each codeword of the first plurality of codewords is a cyclic shifted version of one other of the first plurality of codewords.

17. The apparatus of claim 12, further comprising:
an input to receive a convolutional interleaved coded signal from the burst noise affected communication channel; and
a front-end module to process the convolutional interleaved coded signal to generate the signal; and wherein:
the convolutional interleaved coded signal incurs burst noise within the burst noise affected communication channel.

18. The apparatus of claim 12, wherein:
the apparatus is a first communication device located at a first end of the burst noise affected communication channel; and further comprising:
a second communication device, located at a second end of the burst noise affected communication channel, that includes:
 an encoder to employ a cyclic code to encode the information bits; and
 a convolutional interleaver to interleave the encoded information bits to generate the signal.

19. The apparatus of claim 12, wherein:
the first plurality of codewords includes shortened codewords.

20. The apparatus of claim 19, further comprising:
a zero symbol insertion module, interposed between the shift module and the ensemble decoder, to insert zero-valued symbols into the second plurality of codewords in accordance with a shortening parameter by which the shortened codewords are generated.

21. The apparatus of claim 19, wherein:
the ensemble decoder to account for zero-valued symbols, in predetermined locations within the second plurality of codewords, in accordance with a shortening parameter by which the shortened codewords are generated.

22. The apparatus of claim 12, wherein:
the first plurality of codewords includes extended codewords; and
the shift module to shift cyclically only the non-extended symbols within the extended codewords.

23. The apparatus of claim 12, wherein:
the apparatus is a communication device; and
the communication device is a transceiver or a receiver.

24. The apparatus of claim 12, wherein:
the apparatus is communication device that includes an analog front end therein to effectuate communications within at least one of a satellite communication system, a wireless communication system, a wired communication system, and a fiber-optic communication system.

25. An apparatus, comprising:
at least one communication interface to transmit and receive signals via a communication channel;
a Reed-Solomon (RS) encoder to encode a plurality of information bits to generate a first plurality of RS codewords;

a first shift module to shift cyclically successive RS codewords of the first plurality of RS codewords by successively and uniformly increasing or decreasing numbers of symbols to generate a second plurality of RS codewords;

a convolutional interleaver to interleave the second plurality of RS codewords to generate a signal that is launched into the communication channel, wherein the signal incurs burst noise during transmission via the communication channel;

a convolutional deinterleaver to deinterleave the signal, received from the communication channel, to generate a third plurality of RS codewords;

a second shift module to shift cyclically successive RS codewords of the third plurality of RS codewords complementarily to the cyclical shifting performed by the first shift module such that at least some of the third plurality of RS codewords have burst noise affected symbols in common symbol locations; and an ensemble RS decoder to decode jointly the third plurality of RS codewords to generate a plurality of symbol estimates corresponding to the plurality of information bits.

26. The apparatus of claim 25, wherein:
the RS encoder, the first shift module, and the convolutional interleaver are implemented within a first communication device located at a first end of the communication channel; and
the convolutional deinterleaver, the second shift module, and the RS decoder are implemented within a second communication device located at a second end of the communication channel.

27. The apparatus of claim 26, wherein:
the first communication device and the second communication device are implemented within at least one of a satellite communication system, a wireless communication system, a wired communication system, and a fiber-optic communication system.

28. The apparatus of claim 25, further comprising:
a first shortening module, located before the RS encoder, to insert a plurality of zero-valued bits into the plurality of information bits; and
a second shortening module, interposed between the first shift module and the convolutional interleaver; and wherein:
the RS encoder to encode the plurality of information bits, with the plurality of zero-valued bits inserted therein, to generate the first plurality of RS codewords; and
the second shortening module to remove a plurality of zero-valued symbols from the second plurality of RS codewords that corresponds to the plurality of zero-valued bits.

29. The apparatus of claim 28, further comprising:
a third shortening module, interposed between the second shift module and the RS decoder, to insert the plurality of zero-valued symbols into the third plurality of RS codewords; and wherein:
the RS decoder to decode the third plurality of RS codewords, with the plurality of plurality of zero-valued symbols inserted therein, to generate the plurality of symbol estimates corresponding to the plurality of information bits.

30. The apparatus of claim 28, wherein:
the ensemble decoder to account for the plurality of zero-valued symbols, in predetermined locations within the second plurality of codewords, in accordance with a shortening parameter employed by the first shortening module and the second shortening module.

31. The apparatus of claim 25, wherein:
the first plurality of codewords includes extended RS codewords.

32. An apparatus, comprising:
at least one communication interface to transmit and receive signals via a communication channel;
an encoder to encode a plurality of information bits to generate a first plurality of codewords;
a first shift module to shift cyclically successive codewords of the first plurality of codewords by successively and uniformly increasing or decreasing numbers of symbols to generate a second plurality of codewords;
a convolutional interleaver to interleave the second plurality of codewords to generate a signal that is launched into the communication channel, wherein the signal incurs burst noise during transmission via the communication channel;
a convolutional deinterleaver to deinterleave the signal, received from the communication channel, to generate a third plurality of codewords;
a second shift module to shift cyclically successive codewords of the third plurality of codewords complementarily to the cyclical shifting performed by the first shift module such that at least some of the third plurality of codewords have burst noise affected symbols in common symbol locations; and
an ensemble decoder to decode jointly the third plurality of codewords to generate a plurality of symbol estimates corresponding to the plurality of information bits.

33. The apparatus of claim 32, wherein:
the encoder is a BCH (Bose and Ray-Chaudhuri) encoder; and
the ensemble decoder is an ensemble BCH decoder.

34. The apparatus of claim 32, wherein:
the encoder, the first shift module, and the convolutional interleaver are implemented within a first communication device located at a first end of the communication channel; and
the convolutional deinterleaver, the second shift module, and the decoder are implemented within a second communication device located at a second end of the communication channel.

35. The apparatus of claim 34, wherein:
the first communication device and the second communication device are implemented within at least one of a satellite communication system, a wireless communication system, a wired communication system, and a fiber-optic communication system.

36. The apparatus of claim 32, further comprising:
a first shortening module, located before the encoder, to insert a plurality of zero-valued bits into the plurality of information bits; and
a second shortening module, interposed between the first shift module and the convolutional interleaver; and wherein:
the encoder to encode the plurality of information bits, with the plurality of zero-valued bits inserted therein, to generate the first plurality of codewords; and
the second shortening module to remove a plurality of zero-valued symbols from the second plurality of codewords that corresponds to the plurality of zero-valued bits.

37. The apparatus of claim 36, further comprising:

a third shortening module, interposed between the second shift module and the decoder, to insert the plurality of zero-valued symbols into the third plurality of codewords; and wherein:

the decoder to decode the third plurality of codewords, with the plurality of plurality of zero-valued symbols inserted therein, to generate the plurality of symbol estimates corresponding to the plurality of information bits.

38. The apparatus of claim 36, wherein:

the ensemble decoder to account for the plurality of zero-valued symbols, in predetermined locations within the second plurality of codewords, in accordance with a shortening parameter employed by the first shortening module and the second shortening module.

39. The apparatus of claim 32, wherein:

the first plurality of codewords includes extended codewords.

* * * * *

UNITED STATES PATENT AND TRADEMARK OFFICE
CERTIFICATE OF CORRECTION

PATENT NO. : 8,327,240 B2
APPLICATION NO. : 12/626566
DATED : December 4, 2012
INVENTOR(S) : Thomas J. Kolze Page 1 of 1

It is certified that error appears in the above-identified patent and that said Letters Patent is hereby corrected as shown below:

Col. 18, line 29, in claim 1: after "convolutional deinterleaver to" replace "deinterleaver" with --deinterleave--
Col. 19, line 36, in claim 11: after "the apparatus is" insert --a--
Col. 19, line 45, in claim 12: "convolutional deinterleaver to" replace "deinterleaver" with --deinterleave--
Col. 20, line 57, in claim 24: after "the apparatus is" insert --a--
Col. 21, line 60, in claim 29: after "the plurality of" delete "plurality of"
Col. 23, line 7, in claim 37: after "the plurality of" delete "plurality of"

Signed and Sealed this
Fifth Day of March, 2013

Teresa Stanek Rea
*Acting Director of the United States Patent and Trademark Office*